(12) United States Patent
Noguchi et al.

(10) Patent No.: US 8,044,450 B2
(45) Date of Patent: Oct. 25, 2011

(54) SEMICONDUCTOR DEVICE WITH A NON-VOLATILE MEMORY AND RESISTOR

(75) Inventors: Mitsuhiro Noguchi, Yokohama (JP);
Susumu Yoshikawa, Yokohama (JP);
Koichi Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 10 days.

(21) Appl. No.: 11/174,536

(22) Filed: Jul. 6, 2005

(65) Prior Publication Data
US 2006/0220003 A1 Oct. 5, 2006

(30) Foreign Application Priority Data

Apr. 5, 2005 (JP) .................................. 2005-109075

(51) Int. Cl.
*H01L 29/788* (2006.01)
(52) U.S. Cl. ........ 257/316; 257/314; 257/315; 257/321; 257/536; 257/537; 257/538; 257/E27.009; 257/E27.016; 257/379; 257/380; 257/381
(58) Field of Classification Search .................. 257/314, 257/315, 316, 321, 536, 537, 538, E27.009, 257/E27.016, 379, 380, 381
See application file for complete search history.

(56) References Cited

U.S. PATENT DOCUMENTS

| | | | | |
|---|---|---|---|---|
| 4,682,402 A | * | 7/1987 | Yamaguchi | 438/384 |
| 5,316,978 A | * | 5/1994 | Boyd et al. | 438/382 |
| 5,852,311 A | * | 12/1998 | Kwon et al. | 257/315 |
| 5,879,983 A | * | 3/1999 | Segawa et al. | 438/253 |
| 6,340,611 B1 | * | 1/2002 | Shimizu et al. | 438/201 |
| 6,492,672 B1 | * | 12/2002 | Segawa et al. | 257/296 |
| 6,534,867 B1 | | 3/2003 | Kamiya et al. | |
| 6,610,569 B1 | * | 8/2003 | Shimamoto et al. | 438/257 |
| 6,667,507 B2 | * | 12/2003 | Shirota et al. | 257/315 |
| 6,703,658 B2 | * | 3/2004 | Yaegashi et al. | 257/296 |
| 6,713,834 B2 | | 3/2004 | Mori et al. | |
| 6,921,960 B2 | | 7/2005 | Ichige et al. | |
| 2003/0205756 A1 | * | 11/2003 | Ichige et al. | 257/315 |

(Continued)

FOREIGN PATENT DOCUMENTS

JP S57-202774 12/1982

(Continued)

OTHER PUBLICATIONS

David A. Johns and Ken Martin, "Analog Integrated Circuit Design", 1997, pp. 114-115.*

(Continued)

*Primary Examiner* — Lynne Gurley
*Assistant Examiner* — Hsin-Yi Hsieh
(74) *Attorney, Agent, or Firm* — Oblon, Spivak, McClelland, Maier & Neustadt, L.L.P.

(57) ABSTRACT

A semiconductor device comprising a resistance element with a high resistance and high resistance accuracy and a non-volatile semiconductor storage element is rationally realized by comprising the non-volatile semiconductor storage element comprising a first isolation formed to isolate a first semiconductor area, a first insulator, and a first electrode in a self-aligned manner, and a second electrode, and the resistance element comprising a second isolation formed to isolate a second semiconductor area, a third insulator and a conductor layer in a self-aligned manner, and third and fourth electrodes formed on each end of the conductor layer via a fourth insulator, and connected with the conductor layer. The conductor layer or the third and fourth electrodes include the same material with the first or second electrode, respectively.

21 Claims, 21 Drawing Sheets

U.S. PATENT DOCUMENTS

2004/0175924 A1 * 9/2004 Choi et al. .................. 438/622

FOREIGN PATENT DOCUMENTS

| JP | 02069972 A * | 3/1990 |
|---|---|---|
| JP | H08-288397 | 11/1996 |
| JP | H10-56161 | 2/1998 |
| JP | 2000-150789 | 5/2000 |
| JP | 2001-85617 | 3/2001 |
| JP | 2001-313375 | 11/2001 |
| JP | 2002-110825 | 4/2002 |
| JP | 2002-141469 | 5/2002 |

OTHER PUBLICATIONS

U.S. Appl. No. 13/051,516, filed Mar. 18, 2011, Endo, et al.

* cited by examiner

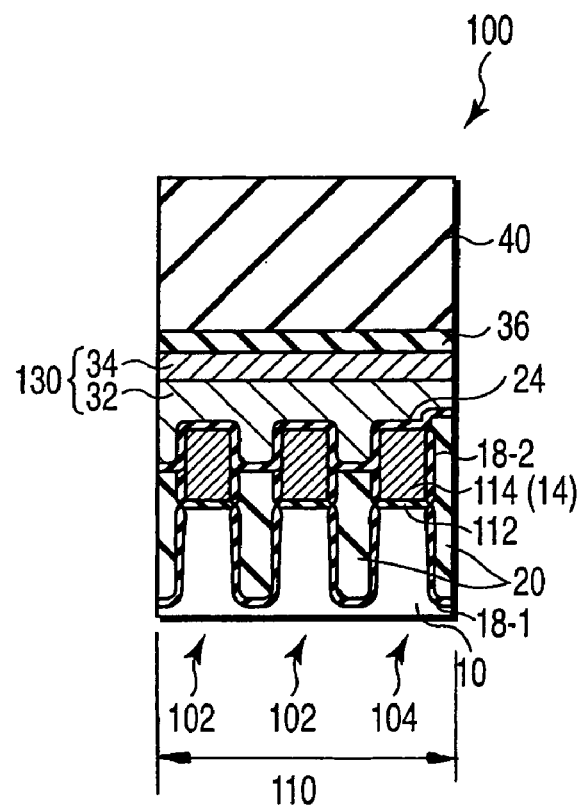
F I G. 2A
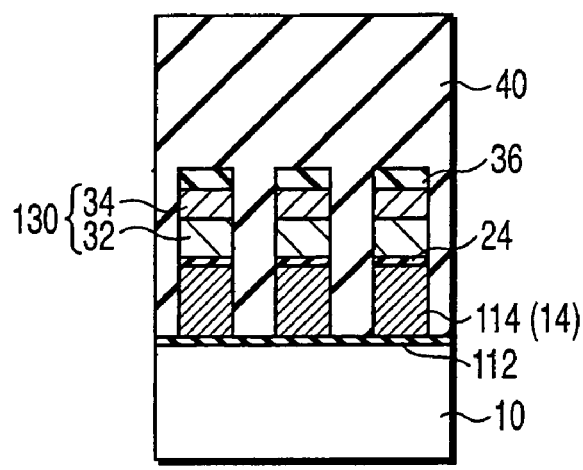
F I G. 2B

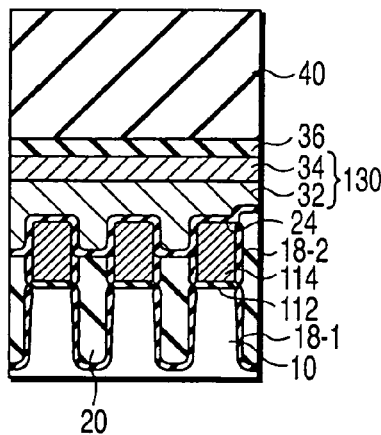
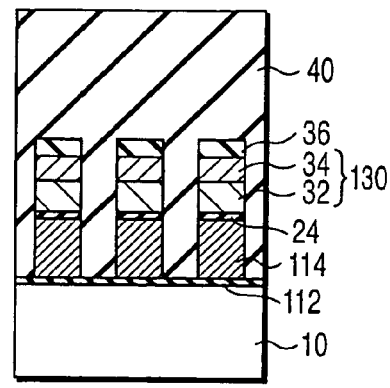
F I G. 11A   F I G. 11B
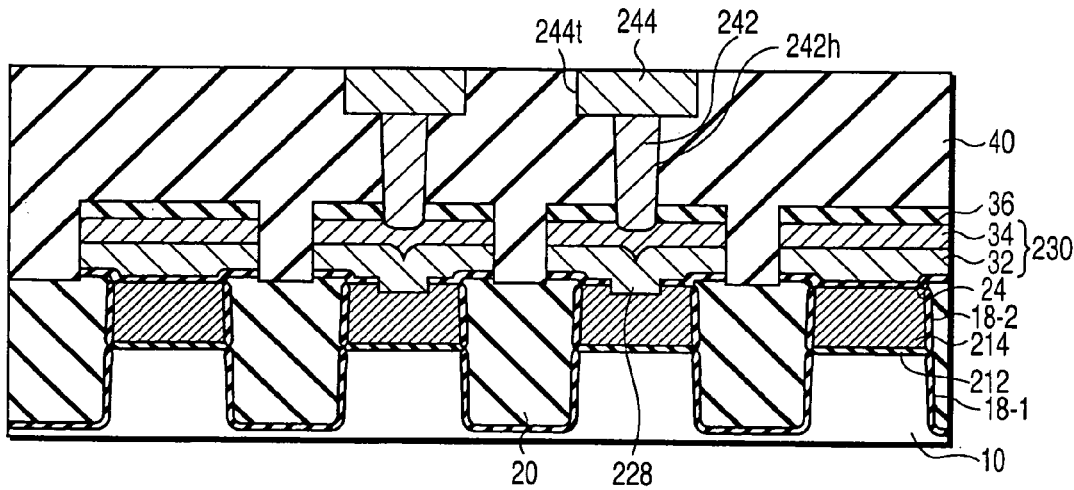
F I G. 11C
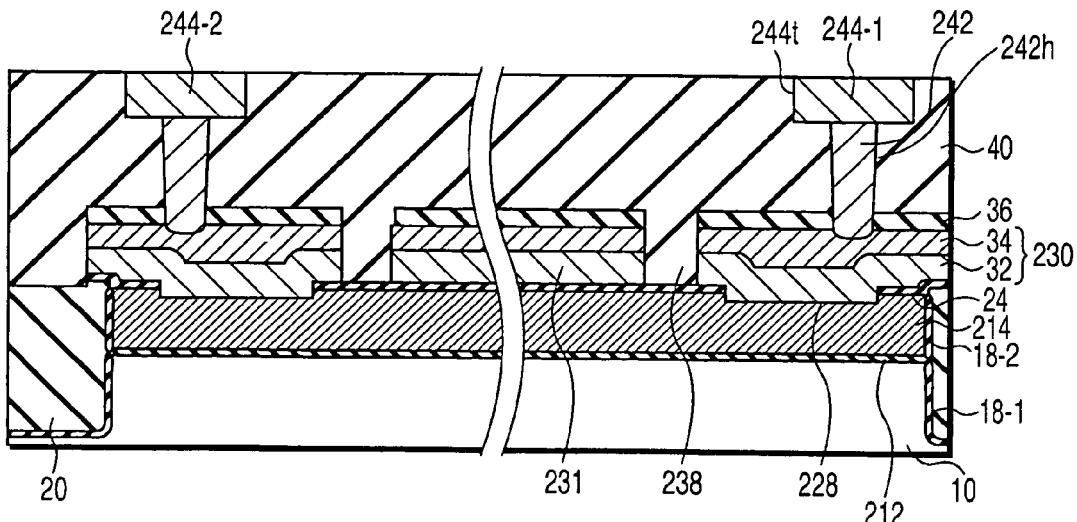
F I G. 11D

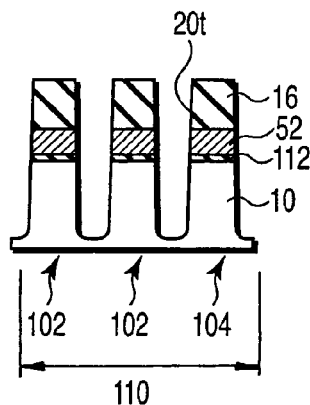
F I G. 13A
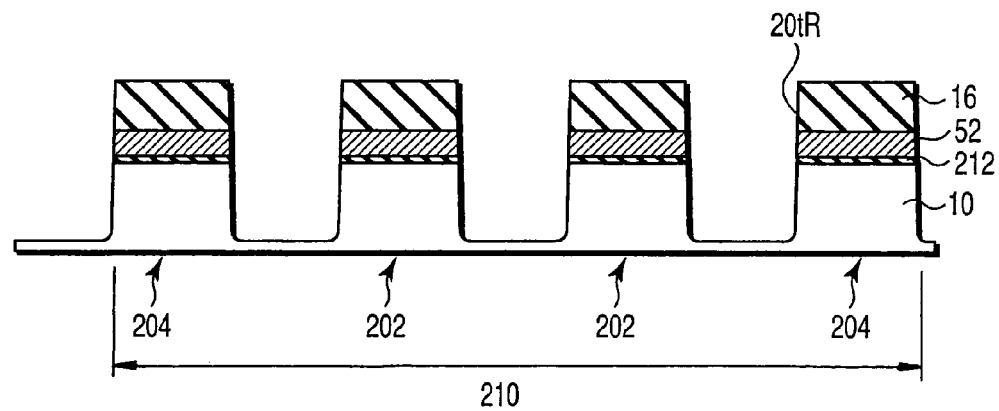
F I G. 13B
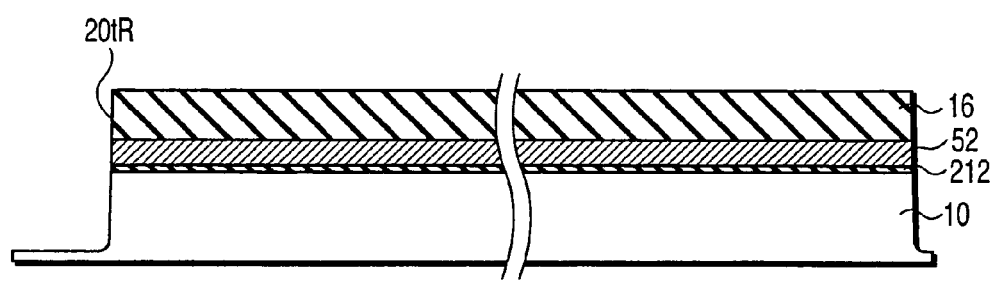
F I G. 13C

SEMICONDUCTOR DEVICE WITH A NON-VOLATILE MEMORY AND RESISTOR

CROSS-REFERENCE TO RELATED APPLICATIONS

This application is based upon and claims the benefit of priority from prior Japanese Patent Application No. 2005-109075, filed Apr. 5, 2005, the entire contents of which are incorporated herein by reference.

BACKGROUND OF THE INVENTION

1. Field of the Invention

The present invention relates to a semiconductor device, and more particularly to a semiconductor device comprising a non-volatile semiconductor storage element and a resistance element.

2. Description of the Related Art

An electrically erasable programmable read-only memory (EEPROM) which is a non-volatile semiconductor storage device has a memory cell having an metal insulator semiconductor field effect transistor (MISFET) structure in which a charge storage layer (a floating gate electrode) and a control gate electrode are laminated above a semiconductor substrate. This memory cell stores data in a non-volatile manner by using a difference in threshold voltage of FET between states in which electronic charge is injected into the charge storage layer and the electronic charge is extracted therefrom. Injection/extraction of the electronic charge is controlled by tunneling current which passes through a tunnel insulator provided between the charge storage layer and a channel being formed in the substrate. Among various types of EEPROMs, a so-called NAND type EEPROM is advantageous to higher integration since the number of select transistors can be reduced as compared with an NOR type EEPROM. The NAND type EEPROM connects a plurality of memory cells in series to constitute an NAND cell unit.

In the NOR type flash memory, data is also erased by flowing tunneling current through the tunnel insulator between the charge storage layer and the channel in the substrate so that the erase operation can be hardly affected by a short channel effect. For example, a plurality of memory cells is simultaneously erased data so that the number of memory cells being erased data in a given time is increased. Therefore, electrons are extracted from the charge storage layer to the substrate by applying a high voltage, which is not smaller than 10V, e.g., a positive voltage of 20V, to a well formed in the semiconductor substrate where the memory cells are formed. On the other hand, when writing data, a well voltage is maintained at 0V, and a positive voltage, which is not smaller than 10V, is applied to a source/drain of the memory cell having a smaller charging/discharging capacitance than that of the well. Since the charging/discharging capacitance of the memory cell is smaller than that of the well, an electric power which charges/discharges the well can be reduced, thereby increasing an operating speed.

In order to allow such an operation, in the NAND-connected memory cells, variation in threshold voltage of non-selected memory cells connected to selected memory cells in series must be sufficiently lowered, and variations in current in a reading operation of the selected memory cells must be reduced. Thus, the positive voltage must be controlled within a variation of 0.5V or less in order to maintain a distribution of the threshold voltage after writing to be narrow and reduce variations in threshold voltage among chips.

Further, in a conventional non-volatile semiconductor storage device, an erase operation, a write operation and a read operation of the non-volatile memory cells are switched by using a signal supplied externally. Therefore, there are required a logical peripheral circuit to change a voltage applied to a well, where memory cells are formed, from the external input and a logical peripheral circuit to output data read from memory cells to the outside. Each of these circuits is constituted of a CMOS circuit in order to reduce power consumption, and uses a voltage of not greater than 5V, e.g., 3.3V or 1.8V as an input/output voltage from/to the outside. This voltage is greatly lower than the voltage of 10V or above required in the write operation or the erase operation.

Thus, in order to perform a feedback control over the positive voltage by the logical peripheral circuit, there is employed, e.g., a method of converting a voltage of 10V or higher into a lower voltage by resistance division. In this case, in a resistance element used for resistance division, a higher resistance is preferable since it can reduce a current flowing through the resistance element and thus reduce a consumed power.

Conventionally, the resistance element is formed by a method, for example, disclosed in Jpn. Pat. Appln. KOKAI Publication No. 2002-110825. A polycrystal silicon which serves as a floating gate electrode is deposited on an entire surface of a semiconductor substrate via a tunnel insulator and then processed by lithography and etching, thereby forming a trench for isolation in the polysilicon and substrate. Then, a thick isolation insulator is deposited to form an isolation. Subsequently, polycrystal silicon which serves as a control gate electrode is deposited on an entire surface and processed by lithography and etching, thereby the control gate electrode and the resistance element are formed from the same material. As to this lithography, since a processing dimension is relatively loose, an less expensive lithography having a lower resolution and lower accuracy can be used. However, when such lithography is used, there occurs a problem that a line width of a stripe-shaped area of the polycrystal silicon, which serves as the resistance element, cannot be finely formed and a variation in the width becomes large. As a result, when obtaining a high resistance, there occurs a problem such as an increased chip size due to increase in the stripe-shaped polycrystal silicon area being formed the high resistance element. Furthermore, if the variation in the width is large, then a relative resistance variation becomes large, thus a larger margin in timing must be required if the resistance element is used in a timing generation circuit of a circuitry.

In another example, as disclosed in Jpn. Pat. Appln. KOKAI Publication No. 2001-85617, there is a technique by which a gate electrode of MOSFET and a resistance element are formed of the same material. In this technique, an isolation is first formed in a semiconductor substrate. Then polycrystal silicon to which a gate electrode is being formed is deposited on an entire surface of the semiconductor substrate via a gate insulator and processed by lithography and etching to form the resistance element and the gate electrode from the same material, simultaneously.

In each of the above-described conventional techniques, an additional lithography to form the resistance element different from the lithography for the isolation is required, thus the number of the lithography steps is increased, which leads to an increase in a manufacturing process cost.

Therefore, there is a need for rationally realizing a semiconductor device comprising a resistance element with a high resistance and high resistance accuracy and a non-volatile semiconductor storage element even if design rule is shrunk.

BRIEF SUMMARY OF THE INVENTION

According to one aspect of the present invention, a semiconductor device comprising: a non-volatile semiconductor storage element; and a resistance element, the non-volatile semiconductor storage element comprising: a first semiconductor area provided on a semiconductor substrate; a first insulator formed in the first semiconductor area; a first electrode formed on the first insulator; a first isolation formed to isolate the first semiconductor area, the first insulator, and the first electrode in a self-aligned manner; a second insulator formed on at least an upper surface of the first electrode; and a second electrode provided in contact with the second insulator, the resistance element comprising: a second semiconductor area provided on the semiconductor substrate; a third insulator formed in the second semiconductor area, and having a thickness thicker than that of the first insulator; a conductor layer formed on the third insulator and at least partially formed of the same material as the first electrode; a second isolation formed to isolate the second semiconductor area, the third insulator and the conductor layer in a self-aligned manner; a fourth insulator formed on an upper surface of the conductor layer; and third and fourth electrodes formed on the fourth insulator at each end of the conductor layer, respectively, including the same material as at least a part of the second electrode therein, and connected with the conductor layer.

According to another aspect of the present invention, a semiconductor device comprising: a non-volatile semiconductor storage element; and a resistance element, the non-volatile semiconductor storage element comprising: a first semiconductor area provided on a semiconductor substrate; a first insulator formed in the first semiconductor area; a first electrode formed on the first insulator, and a width of at least a part thereof being wider than a width of the first semiconductor area; a first isolation formed to isolate the first semiconductor area, the first insulator, and the first electrode in a self-aligned manner; a second insulator formed on at least an upper surface of the first electrode; and a second electrode provided in contact with the second insulator, the resistance element comprising: a second semiconductor area provided on the semiconductor substrate; a third insulator formed in the second semiconductor area, and having a thickness thicker than that of the first insulator; a conductor layer which is formed on the third insulator, including the same material as the first electrode therein, and a width of at least a part thereof being wider than a width of the second semiconductor area; a second isolation formed to isolate the second semiconductor area, the third insulator and the conductor layer in a self-aligned manner; a fourth insulator formed on an upper surface of the conductor layer; and third and fourth electrodes formed on the fourth insulator at each end of the conductor layer, respectively, including the same material as at least a part of the second electrode therein, and connected with the conductor layer.

BRIEF DESCRIPTION OF THE SEVERAL VIEWS OF THE DRAWING

FIGS. 1A and 1B are plan views of a semiconductor device according to a first embodiment of the present inventions, in which FIG. 1A shows a non-volatile semiconductor storage element and FIG. 1B shows a resistance element, respectively;

FIGS. 2A and 2B are views showing a cross-sectional structure of the non-volatile semiconductor storage element in the semiconductor device according to the first embodiment of the present invention shown in FIG. 1A, in which FIG. 2A is a cross-sectional view in a direction parallel to a control gate electrode taken along a cutting-plane line 2A-2A in FIG. 1A and FIG. 2B is a cross-sectional view in a direction orthogonal to the control gate electrode taken along a cutting-plane line 2B-2B in FIG. 1A;

FIGS. 3A to 3C are views showing a cross-sectional structure of the resistance element in the semiconductor device according to the first embodiment of the present invention shown in FIG. 1B, in which FIG. 3A is a cross-sectional view in a direction cutting across resistance element components in an electrode section of the resistance element taken along a cutting-plane line 3A-3A in FIG. 1B, FIG. 3B is a cross-sectional view in a direction cutting across the resistance element components in an electrode separation area of the resistance element taken along a cutting-plane line 3B-3B in FIG. 1B, and FIG. 3C is a cross-sectional view in a longitudinal direction of the resistance element component taken along a cutting-plane line 3C-3C in FIG. 1B;

FIGS. 4A to 11D are views illustrating an example of a manufacturing process of the semiconductor device according to the first embodiment of the present invention;

FIGS. 12A to 12D are views illustrating a cross-sectional structure of a semiconductor device according to a second embodiment of the present invention, in which FIG. 12A is a cross-sectional view in a direction parallel to a control gate electrode of a non-volatile semiconductor storage element taken along the cutting-plane line 2A-2A in FIG. 1A, FIG. 12B is a cross-sectional view in a direction orthogonal to the control gate electrode taken along the cutting-plane line 2B-2B in FIG. 1A; FIG. 12C is a cross-sectional view in a direction cutting across resistance element components in an electrode section of the resistance element taken along the cutting-plane line 3A-3A in FIG. 1B, and FIG. 12D is a cross-sectional view in a longitudinal direction of the resistance element component taken along the cutting-plane line 3C-3C in FIG. 1B;

FIGS. 13A to 17D are views illustrating an example of a manufacturing process of the semiconductor device according to the second embodiment of the present invention;

FIGS. 18A to 18D are views showing a cross-sectional structure of a semiconductor device according to a third embodiment of the present invention, in which FIG. 18A is a cross-sectional view in a direction parallel to a control gate electrode of a non-volatile semiconductor storage element taken along the cutting-plane line 2A-2A in FIG. 1A, FIG. 18B is a cross-sectional view in a direction orthogonal to the control gate electrode taken along the cutting-plane line 2B-2B in FIG. 1A, FIG. 18C is a cross-sectional view in a direction cutting across resistance element components in an electrode section of the resistance element taken along the cutting-plane line 3A-3A in FIG. 1B, and FIG. 18D is a cross-sectional view in a longitudinal line of the resistance element component taken along the cutting-plane line 3C-3C in FIG. 1B.

DETAILED DESCRIPTION OF THE INVENTION

Figure 1A:
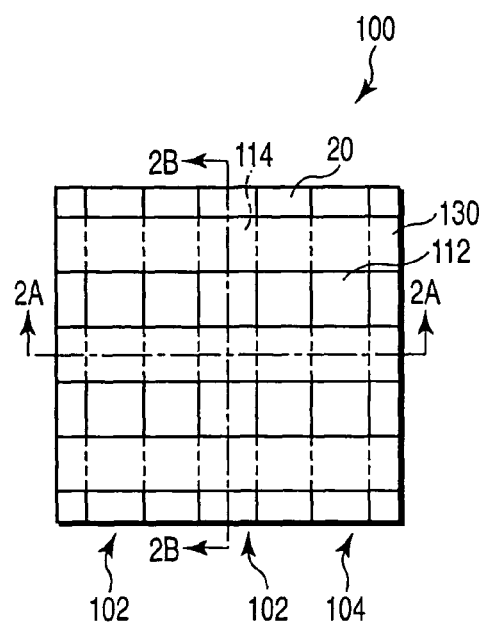

The embodiments of the present invention will be described with reference to the accompanying drawings. Throughout the drawings, corresponding portions are denoted by corresponding reference numerals. Each of the following embodiments is illustrated as one example, and therefore the present invention can be variously modified and implemented without departing from the spirits of the present invention.

According to the present invention, there is provided a semiconductor device in which an isolation to form a floating gate electrode of a non-volatile semiconductor storage element or a conductor layer of a resistance element and an isolation in an active area of a semiconductor substrate are simultaneously formed in a self-aligned manner. As a result, it can be rationally realized the resistance element having a high resistance and high resistance accuracy and the non-volatile semiconductor storage element even if design rule is shrunk.

First Embodiment

Figure 3A:
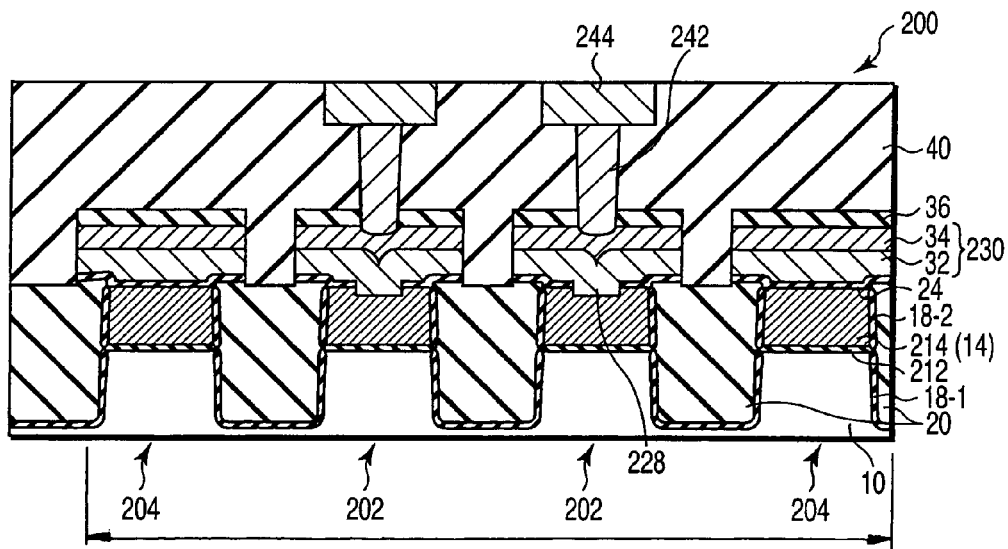
Figure 3B:
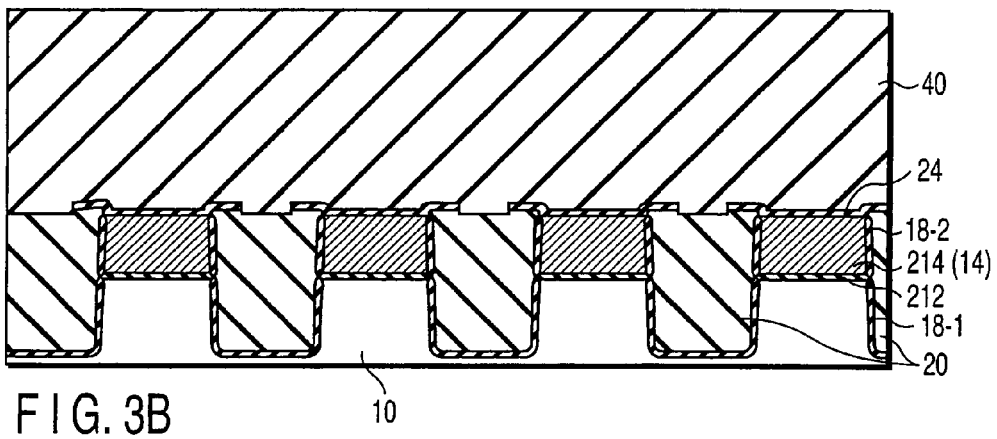
Figure 3C:
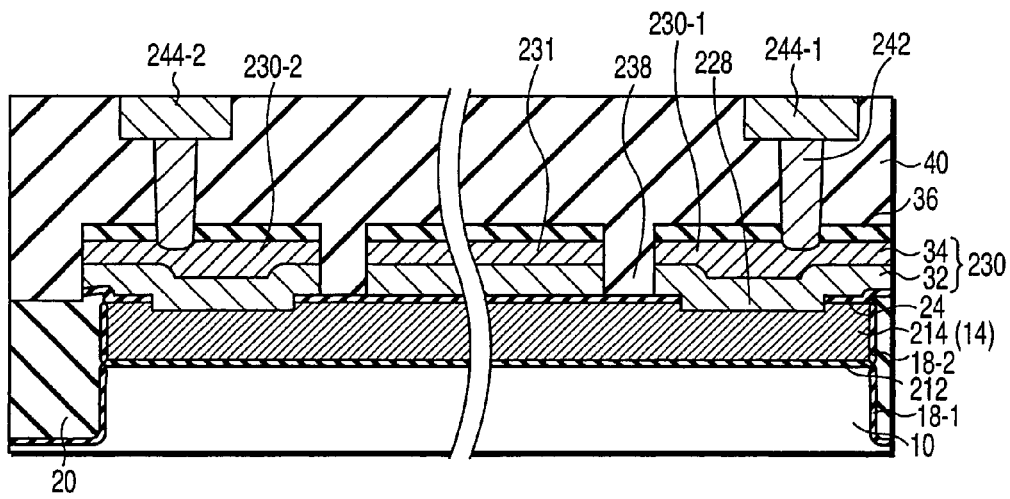

FIGS. 1A to 3C show an example of a first embodiment of a semiconductor device according to the present invention. This semiconductor device comprises a non-volatile semiconductor storage element 100 and a resistance element 200. FIGS. 1A and 1B are plan views of the semiconductor device according to the present embodiment, in which FIG. 1A shows the non-volatile semiconductor storage element 100 and FIG. 1B shows the resistance element 200. FIGS. 2A and 2B are views showing a cross-sectional structure of the non-volatile semiconductor storage element 100, in which FIG. 2A is a cross-sectional view in a direction parallel to a control gate electrode 130 taken along a cutting-plane line 2A-2A in FIG. 1A, and FIG. 2B is a cross-sectional view in a direction orthogonal to the control gate electrode 130 taken along a cutting-plane line 2B-2B in FIG. 1A. FIGS. 3A to 3C are views showing a cross-sectional structure of the resistance element 200, in which FIG. 3A is a cross-sectional view in a direction cutting across resistance element components 202 in an electrode section of the resistance element taken along a cutting-plane line 3A-3A, FIG. 3B is a cross-sectional view in a direction cutting across the resistance element components 202 in an electrode separation area 238 of the resistance element taken along a cutting-plane line 3B-3B in FIG. 1B, and FIG. 3C is a cross-sectional view in a longitudinal direction of the resistance element component 202 taken along a cutting-plane line 3C-3C in FIG. 1B. It is to be noted that FIGS. 1A and 1B are plan views in which a surface of the control gate electrode 130 or an electrode 230 of the resistance element is shown as a reference plane for the better understanding of the structure.

Referring to FIGS. 1A, 2A and 2B, the non-volatile semiconductor storage element 100 includes a plurality of memory cells 102 and dummy cells 104 surrounding the memory cells 102 formed in a memory cell area 110. In FIG. 1A, a plurality of floating gate electrodes 114 are formed in a grid form, and right and lefts sides of the each floating gate electrodes 114 are separated by isolations 20 in the drawing. A plurality of control gate electrodes 130 are formed on the floating gate electrodes 114 extending in the horizontal direction in the drawing.

Referring to FIG. 1B and FIGS. 3A to 3C, the resistance element 200 includes resistance element components 202 formed in parallel to each other and resistance dummies 204 arranged at least on both sides of the resistance element components 202 in a resistance element area 210. The resistance element component 202 comprises a stripe-shaped first conductor layer 214, electrodes 230 formed at each of both ends on the first conductor layer 214 and wirings 244 connected to the electrode 230.

The floating gate electrode 114 of the non-volatile semiconductor storage element 100 and the first conductor layer 214 having a high resistance in the resistance element 200 are constituted of the same first conductor film 14. Likewise, the control gate electrode 130 of the non-volatile semiconductor storage element 100 and the electrode 230 of the resistance element 200 are constituted of the same laminated film including a second conductor film 32 and a metal film 34. Furthermore, an isolation 20 of the semiconductor substrate 10 in the non-volatile semiconductor storage element area 110 or the resistance element area 210 and an isolation 20 between the memory cells 102 or the resistance element components 202 formed on the semiconductor substrate 10 are simultaneously formed in a self-aligned manner by a single lithography and etching. That is, the first conductor film 14, the first or second insulator 112 or 212 on the semiconductor substrate and the semiconductor substrate 10 are simultaneously processed in the self-aligned manner, thus the isolation 20 of the memory cells 102 or the resistance element components 202 are simultaneously formed as a single isolation 20 in and on the semiconductor substrate 10.

The lithography having a high accuracy and a high resolution can be used for forming the isolation 20 of the first conductor layer 214 having a high resistance in the resistance element 200 by using the same lithography and etching as the isolation 20 of the non-volatile storage element 100. Therefore, there can be obtained an advantage that a line width of the first conductor layer 214 having a high resistance can be narrowed and a variation in the line width can also be reduced. As a result, an area of the first conductor layer 214 of the resistance element 200 from which a high resistance is to be obtained can be reduced, thus decreasing an area of the semiconductor device.

Furthermore, an additional lithography for forming the resistance element 200 which is required in the prior art and is different from that for forming the isolation 20 of the semiconductor substrate 10 is no longer necessary. As a result, the number of lithography steps with higher accuracy than that of the lithography forming the memory cells is not increased, thereby leading a reduction in manufacturing cost.

In this manner, the resistance element 200 having a high resistance and high accuracy and the non-volatile semiconductor storage element 100 can be rationally realized even if design rule is shrunk.

Figure 1B:
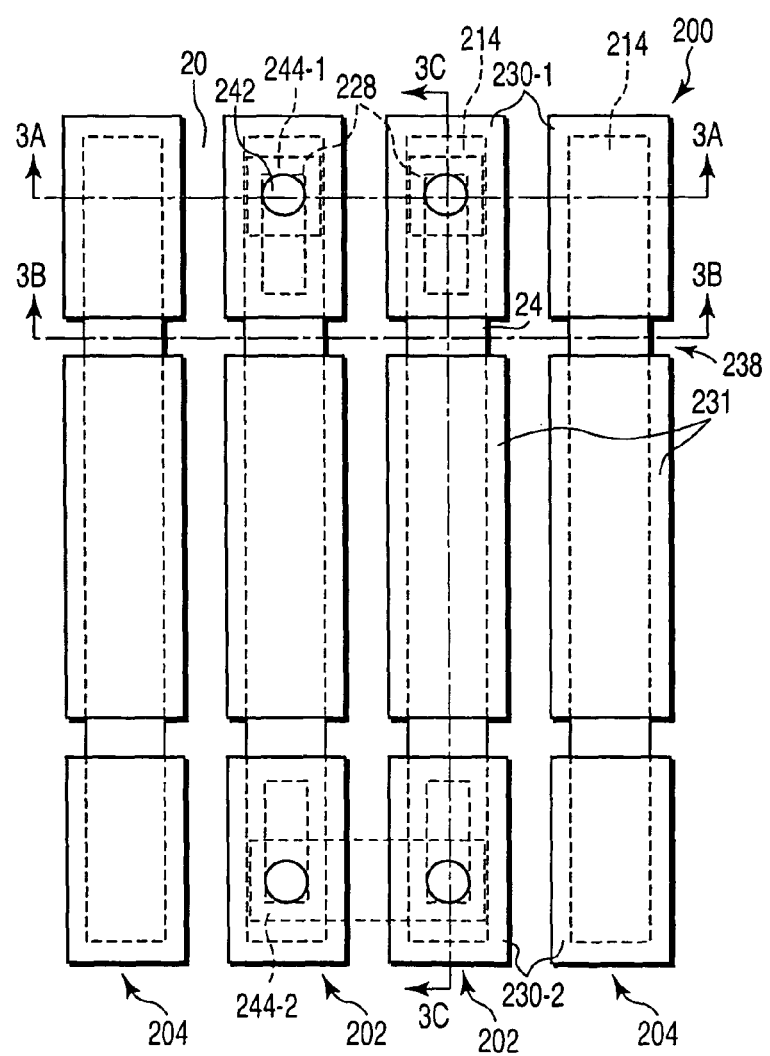

FIG. 1B shows two resistance element components 202 and two resistance dummies 204 disposed at both sides. Here, although the drawing shows a structure in which the two resistance element components 202 are sandwiched between the two resistance dummies 204, it can be employed a structure in which a plurality of resistance element components 202 are sandwiched between at least two resistance dummies 204. Moreover, the first conductor layer 214 which serves as a high resistance has a long and stripe-shaped shape. For example, as shown in FIG. 3C, each resistance element component 202 is connected with an electrode conductor layer 32 and an electrode metal layer 34 through an opening 228 provided at each of both ends of the first conductor layer 214, and further connected with the wiring 244 through a contact 242. In FIG. 1B, an electrode 230-1 of the resistance element shown in an upper part of the drawing is connected with a wiring 244-1. In the resistance element 200, for example, the electrodes 230-2 of the resistance element shown in a lower part of FIG. 1B are connected with each other through a wiring 244-2 so that each resistance element components 202 are connected in series. In this example, there is shown the resistance element 200 which divides a potential difference between two upper wirings 244-1 into one half by using the two resistance element components 202. Of course, a voltage division ratio can be changed by varying the number of the resistance element components 202 connected in series.

An example of a manufacturing process of the semiconductor device according to the present embodiment will now be described hereinafter with reference to process cross-sectional views of FIGS. 4A to 11D. Each view A of FIGS. 1A to 8A is a cross-sectional view of the non-volatile semiconductor element in a direction parallel to the control gate electrode 130 taken along the cutting-plane line 2A-2A in FIG. 1A, each view B of FIGS. 4B to 8B is a cross-sectional view of the resistance element 200 in a direction cutting across the resistance element components 202 in an electrode section of the resistance element taken along the cutting-plane line 3A-3A in FIG. 1B, and each view C of FIGS. 4C to 8C is a cross-sectional view in a longitudinal direction of the resistance element component 202 taken along the cutting-plane line 3C-3C in FIG. 1B.

Figure 4A:
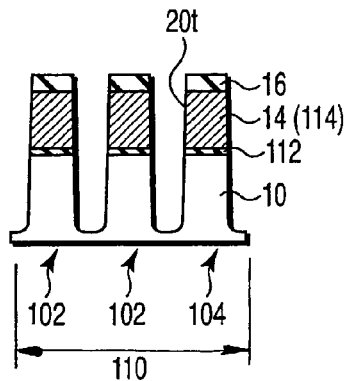
Figure 4B:
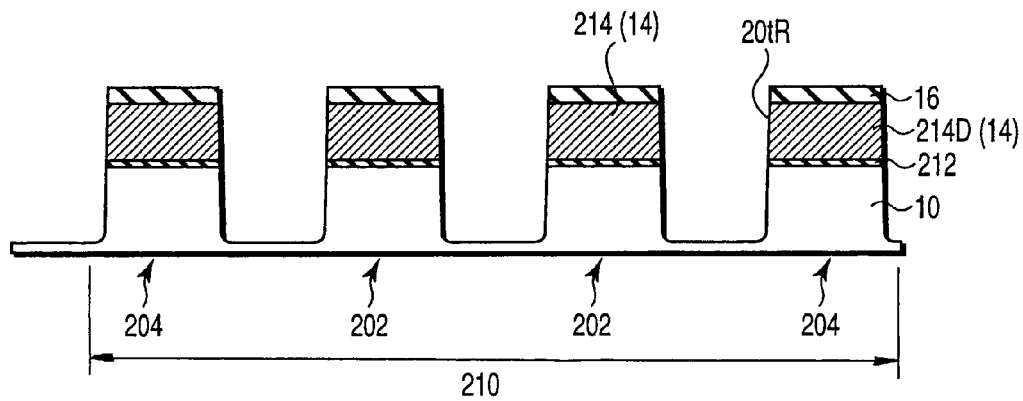
Figure 4C:
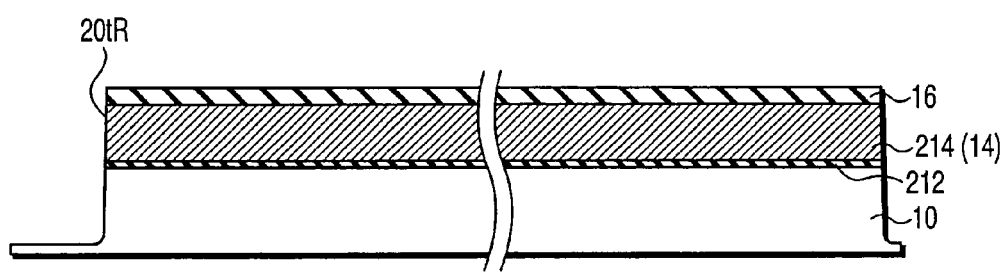

(1) First, as shown in FIGS. 4A to 4C, the first conductor film 14 is being deposited on the semiconductor substrate 10, e.g., a silicon substrate via first or second insulator 112 or 212 and then isolation trench 20t is being formed to separate both the first conductor film 14 and the silicon substrate 10 in a self-aligned manner.

Specifically, referring to FIG. 4A, the first insulator 112 which serves as a tunnel insulator 112 is formed on the silicon substrate 10 in the memory cell area 110 where the semiconductor storage element 100 is formed. As the silicon substrate 10, it can be used a p-type silicon substrate or a silicon substrate having a p-type semiconductor area formed thereto. As the tunnel insulator, it can be used a silicon oxide film ($SiO_2$ film) or a silicon oxynitride film (SiON film) having a film thickness ranging from 4 nm to 12 nm.

Then, the second insulator 212 which electrically isolates the resistance element 200 and the silicon substrate 10 is formed on the silicon substrate 10 in the resistance element area 210. As the second insulator 212, it can be used $SiO_2$ film or SiON film which is thicker than the first insulator 112 and has a film thickness ranging from, e.g., 13 nm to 50 nm. If a film thickness of this second insulator 212 is set to, e.g., 13 nm or thicker, then a tunneling current is not flowed even if a high voltage of 5V or higher is applied between the second insulator 212 and the silicon substrate 10, thus the deterioration in reliability of the resistance element 200 can be suppressed. As a result, it can be realized the resistance element 200 with the high reliability which allows obtaining a low voltage by resistance division when a high voltage of 10V or higher required for a write operation in the flash memory is applied to the resistance element 200. Moreover, the second insulator 212 can be formed in common with, for example, a gate insulator of a high-voltage transistor (not shown) to which a voltage of, e.g., 5V or higher is applied.

Additionally, in regard to a dopant concentration of the silicon substrate 10 in the resistance element area 210, by doping $10^{16}$ $cm^{-3}$ or more of boron B as a surface concentration, an inversion threshold voltage of the silicon substrate 10 can be increased and a parasitic capacitance of the resistance element 200 with respect to the substrate can be reduced. As a result, it can be realized the resistance element 200 by which an increase in CR delay due to the parasitic capacitance can be suppressed.

Then, the first conductor film 14 is formed on the first and second insulators 112 and 212. The first conductor film 14 is being processed to become each floating gate electrode 114 of the non-volatile semiconductor storage element 100 and the first conductor layer 214 of the resistance element 200. As the first conductor film 14, it can be used polycrystal silicon or silicon germanium (SiGe) having a film thickness ranging from, e.g., 20 nm to 200 nm.

A cap insulator 16 is formed on an entire surface of the first conductor film 14. As the cap insulator 16, it can be used a silicon nitride film (SiN film) or $SiO_2$ film having a film thickness ranging from, e.g., 20 nm to 300 nm.

Then, an isolation trench 20t is formed in an area where an isolation is formed by lithography and etching. Specifically, the cap insulator 16, the first conductor film 14, the first or second insulator 112 or 212, and the silicon substrate 10 are sequentially etched. As a result, the isolation trench 20t for the floating gate electrode 114 or the first conductor layer 214, the first or second insulator 112 or 212, and the silicon substrate 10 are formed in the self-aligned manner. A depth of the isolation trench 20t formed in the silicon substrate 10 falls in a range from, e.g., 100 nm to 400 nm. A width and interval of the trench 20t in the memory cell area 100 fall in a range from, e.g., 10 nm to 140 nm.

The plurality of resistance element components 202 and at least two resistance dummies 204 disposed at both sides are formed with the same element width and isolation trench width in the resistance element area 210. In the structure, the first conductor layer 214 of the resistance element components 202 serves as a high-resistance area of the resistance element 200. A width and interval of isolation trench 20tR of the resistance element components 202 and the resistance dummies 204 are set as values sufficiently larger than those in the memory cell area 110, thereby reducing a resistance change due to variation in dimension. Therefore, it is desirable to form the width and interval of the trench 20tR of the resistance element components 202 and the resistance dummies 204 to fall within a range from, e.g., 150 nm to 500 nm. In this example, the first conductor layer 214D of the resistance dummies 204 is formed with the same width in parallel with the first conductor layer 214 of the resistance element components 202, and each isolation trench 20tR of the resistance element 200 is formed with the same width.

The resistance dummy 202 is formed in adjacent to at least one resistance element component 202 to prevent from causing a variation in dimension due to unevenness of pattern and make the resistance element 200 to have more uniform width. That is because a periodic pattern can reduce a variation in dimension in the lithography and prevent from causing a micro loading effect in etching by which an etching depth or a taper on etched side surface is vary depending on the trench width. Furthermore, a length of the resistance element component 202 in the longitudinal direction can be made sufficiently larger than a width of the same and it can be set to a value of, for example, 1 μm to 1 mm.

In formation of the isolation trench 20t, the first conductor film 14 and the silicon substrate 10 are processed in the self-aligned manner, and it is preferable that a corner of the processed first conductor film 14 has a shape not to fall in toward the silicon substrate 10.

In this manner, the isolation trench 20t, the floating gate electrode 114 or the first conductor layer 214 being formed from the first conductor film 14, and the semiconductor active areas 110 and 210 of the silicon substrate 10 are processed in the self-aligned manner, thereby forming the cross-sectional structure shown in FIGS. 4A to 4C.

Figure 5A:
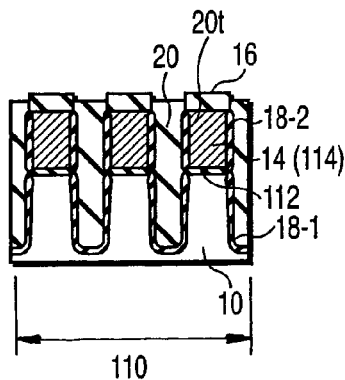
Figure 5B:
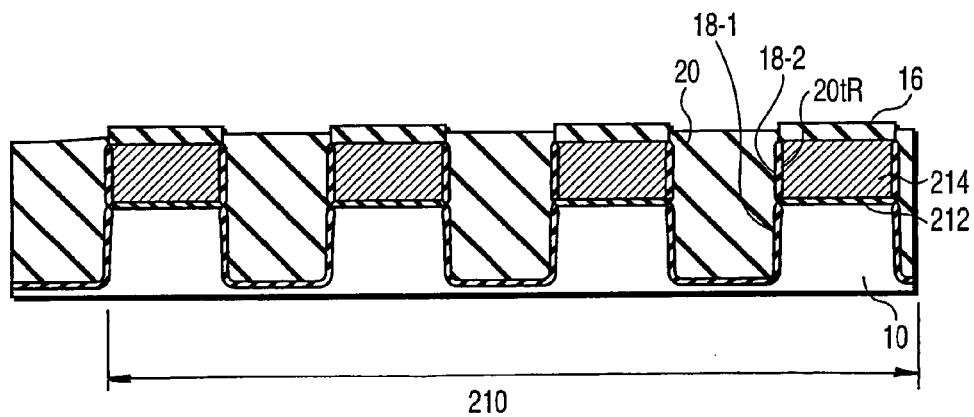
Figure 5C:
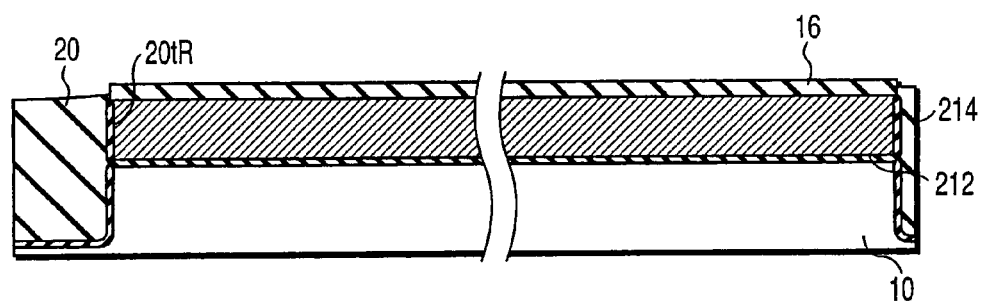

(2) Then, the isolation 20 is being formed as shown in FIGS. 5A to 5C.

Specifically, first, a thin third insulator 18 is formed on an inner surface of each isolation trench 20t as required. The third insulator has a film thickness ranging from, e.g., 1 nm to 30 nm, and it can be used $SiO_2$ film formed by thermal oxidation or oxygen plasma oxidation or high temperature oxide (HTO), which is $SiO_2$ film formed by a deposition method at a temperature ranging from 700° C. to 900° C. It is to be noted that reference numeral 18-1 denotes a third insulator formed on a side surface of the silicon substrate 10, and reference numeral 18-2 designates a third insulator formed on a side surface of the first conductor film 14 which serves as the floating gate electrode 114 or the first conductor layer 214. As a result, the first conductor film 14 which becomes the floating gate electrode 114 and the first conductor layer 214 are formed so that it does not hang down to the isolation 20. The isolation 20 separates the memory cell area 110 and the resistance element area 210. This realizes a fine structure of the memory cells and suppresses variations in memory cell characteristics due to concentration of an electric field at the corner of the silicon substrate since the floating gate electrode 114 is not formed to cover the corner of the silicon substrate 10 in the memory cell area 110.

Then, an isolation insulator 20 is thickly deposited on an entire surface to fill the isolation trench 20t by $SiO_2$ film formed by, e.g., an high density plasma (HDP) or HTO, or a film of, e.g., polysilazane which is transformed into $SiO_2$ film.

Thereafter, the isolation insulator 20 deposited on the cap insulator 16 is planarized by, e.g., chemical mechanical polishing (CMP) with the cap insulator 16 being used as a stopper. The surface of the isolation insulator 20 filled in the trench 20t is removed by CMP to provide a height slightly lower than an upper surface of the cap insulator 16.

In this manner, as shown in FIGS. 5A to 5C, the isolation 20 can be formed in the self-aligned manner with the first conductor film 14, which becomes the floating gate electrode 114 and the first conductor layer 214, the semiconductor active areas 110 and 210 of the silicon substrate 10.

Figure 6A:
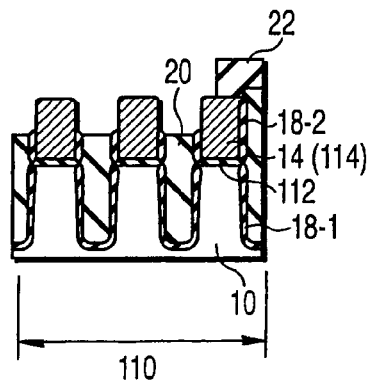
Figure 6B:
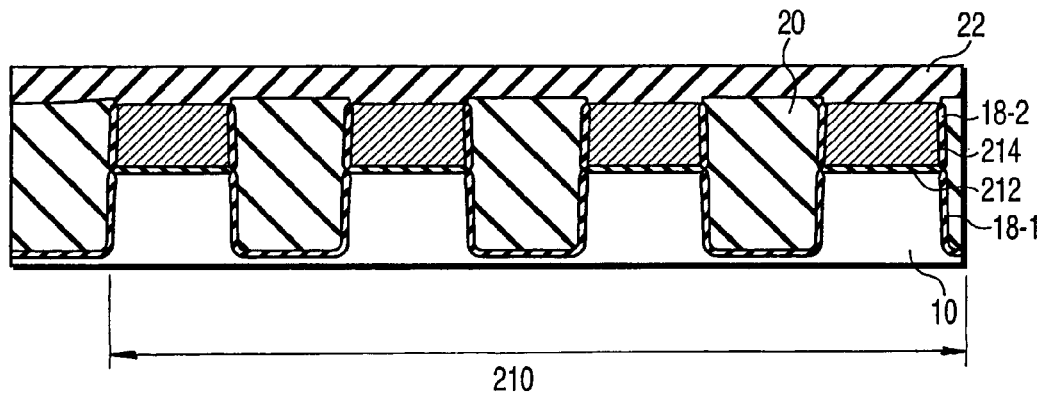
Figure 6C:
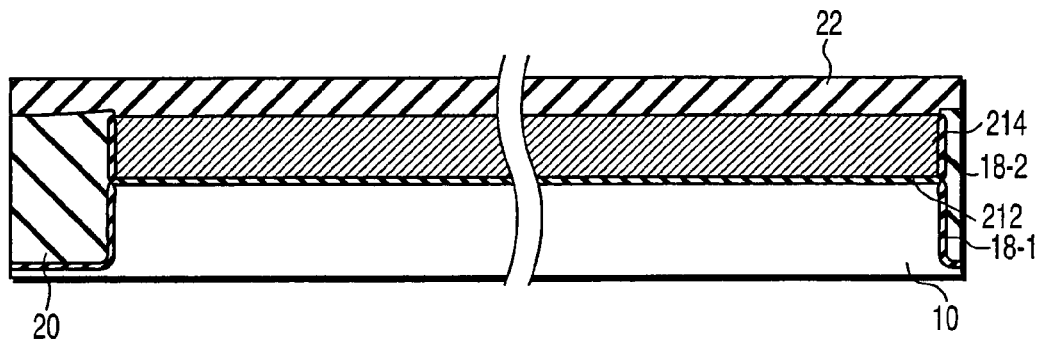

(3) Then, as shown in FIGS. 6A to 6C, the isolation insulator 20 in the memory cell area 110 is being recessed to a desired height.

Specifically, the cap insulator 16 is first removed. For example, if the cap insulator 16 is SiN film, only the cap insulator 16 can be readily removed by using, e.g., a chemical liquid such as hot phosphoric acid.

Subsequently, referring to FIGS. 6A to 6C, a first resist 22 is applied on an entire surface, and the first resist on the memory cell area is removed by lithography and etching. Then, as shown in FIG. 6A, in the memory cell area 110, the isolation insulator 20 and the third insulator 18-2 in the isolation trench 20t are partially recessed to a desired height by etching back. It is to be noted that the height of the isolation insulator 20 is not lower than a height of a boundary between the floating gate electrode 114 and the first insulator 112 as the tunnel insulator. By exposing the upper surface and the side surface of the floating gate electrode 114 in this manner, an area in which the floating gate electrode 114 of the memory cell comes into contact with a control gate electrode 130 which is formed in a later process can be increased as compared with that in case of exposing the upper surface alone of the floating gate electrode 114, in other word, a capacitance between the floating gate electrode 114 and the control gate electrode 130 can be increased. Thereby the memory cell having higher reliability can be formed even if a fourth insulator 24 (formed in a next process) with a lower breakdown voltage is used between the floating gate electrode 114 and the control gate electrode 130.

It is to be noted that the isolation insulator 20 in the resistance element area 210 is not etched back in this process. As a result, even if a voltage of 10V or above is applied to the electrode 230 of the resistance element which is formed later and 0V is applied to the silicon substrate 10, a high breakdown voltage between these members can be realized with the isolation insulator 20 sandwiched, thereby achieving the resistance element 20 having the higher reliability.

In this manner, the structure shown in FIGS. 6A to 6C in which the isolation insulator 20 in the memory cell area 110 is recessed to a desired height can be formed.

Figure 7A:
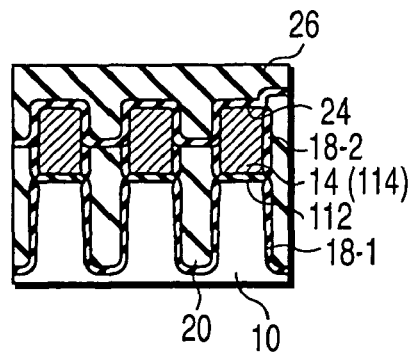
Figure 7B:
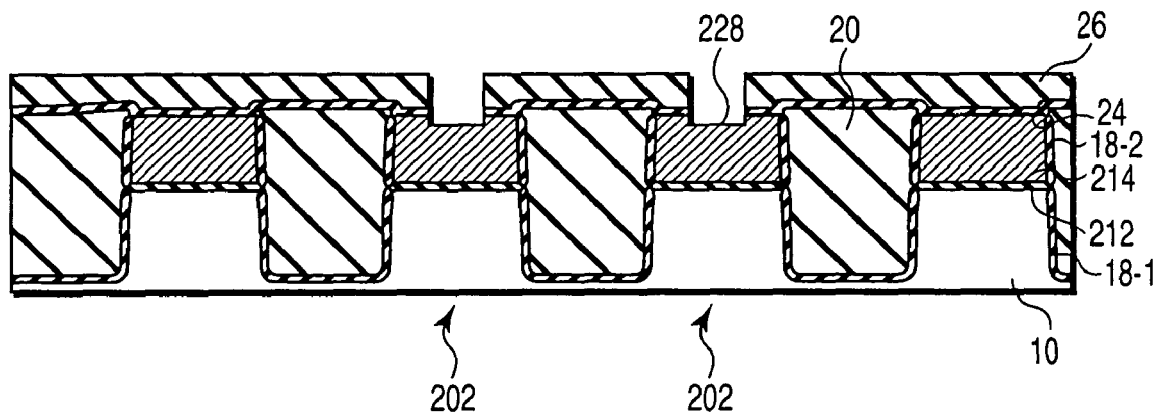
Figure 7C:
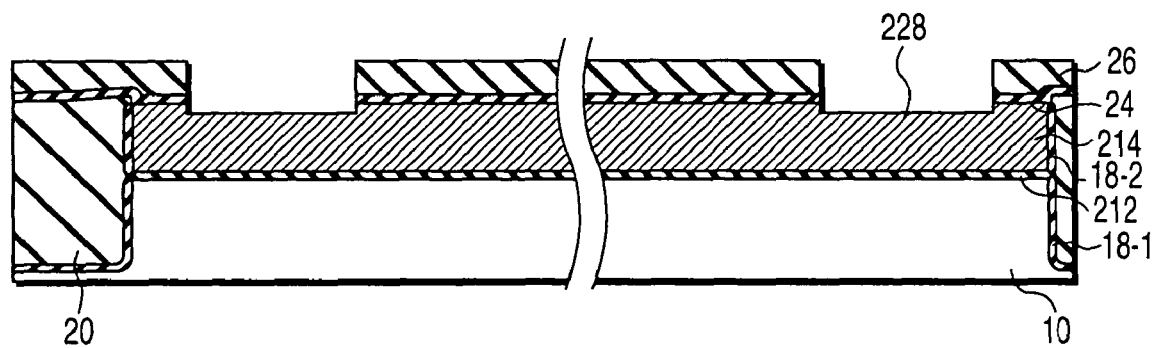

(4) Then, as shown in FIGS. 7A to 7C, a fourth insulator 24 is being formed on surface of the first conductor film 14 from which the floating gate electrode 114 of the non-volatile semiconductor storage element 100 and the first conductor layer 214 of the resistance element 200 are to be formed, and an opening 228 which connects the first conductor layer 214 with the electrode 230 of the resistance element to be formed in the next process is being formed at each end of the resistance element component 202.

Specifically, the first resist 22 is first removed by using, e.g., asher or a mixture containing hydrogen peroxide sulfate solution. Referring to FIGS. 7A to 7C, a fourth insulator 24 is formed on the first conductor film 14 being formed the floating gate electrode 114 and the first conductor layer 214. As the fourth insulator 24, it can be used $SiO_2$ film having a film thickness ranging from 8 nm to 20 nm or a so-called ONO film which has a three-layered structure of $SiO_2$ film/SiN film/$SiO_2$ film and each film thickness ranging from 3 nm to 10 nm.

Then, a second resist 26 is applied on an entire surface and, as shown in FIGS. 7B and 7C, the second resist 26 at the parts close to both ends of the resistance element component 202 is removed by lithography and etching to form the openings 228, thereby exposing the fourth insulator 24. Then, the fourth insulator 24 is removed by, e.g., anisotropic etching which etches $SiO_2$ film and SiN film using the second resist 26 as a mask, thereby forming openings 228. An area from which the second resist 26 is removed by this etching is a long area in the longitudinal direction on the first conductor layer 214 of the resistance element component 202 as shown in FIGS. 7B and 7C. As a result, a contact area between the first conductor layer 214 and a second conductor film 232 being formed on the first conductor layer 214 in the next step can be increased, thus a parasitic resistance of the contact between the conductor films can be reduced. Moreover, it is preferable to form the opening 228 within a width of the first conductor film 214 for an etching to form the electrode 230 of the resistance element described later. A width of the opening 228 can be made narrower than the width of the first conductor film 214 shown in FIG. 7B, and it can be set to, e.g., 20 nm to 100 nm. A length of the opening 228 can be set to, e.g., 50 nm to 10 μm. The resistance element 200 does not need to be designed with such a minimum design dimension as demanded in the memory cell 102, and the opening 228 can be formed by a lithography device which is less expensive and has a lower resolution as compared with that for forming the memory cell area 110. Additionally, in this example, no opening needs to be provided to the resistance dummy 204.

In this manner, as shown in FIGS. 7B and 7C, the opening 228 can be formed to the fourth insulator 24 of the resistance element component 202, thereby partially exposing the first conductor layer 214.

Figure 8A:
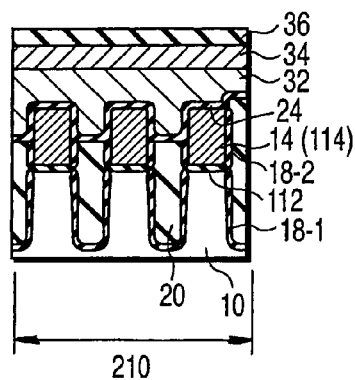
Figure 8B:
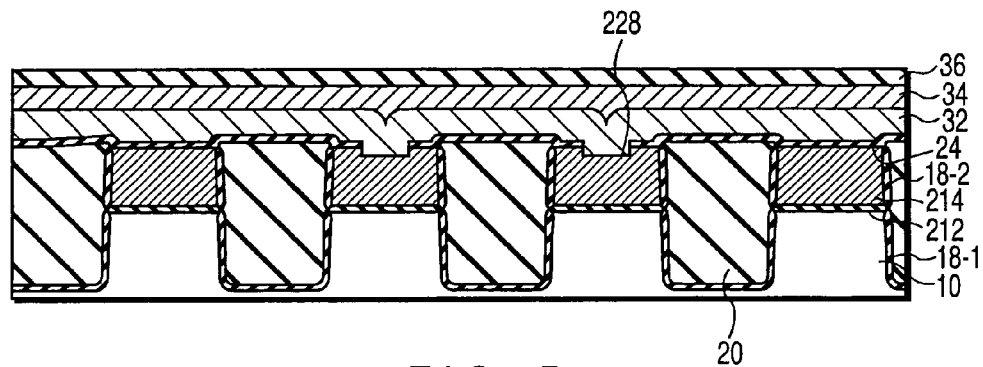
Figure 8C:
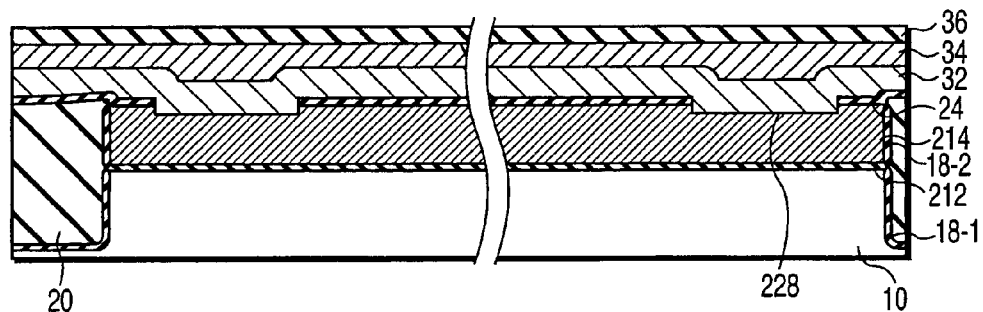

(5) Then, as shown in FIGS. 8A to 8C, electrode material films 32 and 34 are being deposited on an entire surface in order to form a control gate electrode 130 of the non-volatile semiconductor storage element 100 and an electrode 230 of the resistance element 200.

That is, a second conductor film 32 is deposited on an entire surface in a film thickness ranging from, e.g., 10 nm to 300 nm. As the second conductor film 32, polycrystal silicon in which a dopant is doped at a high concentration can be used. The second conductor film 32 is formed to excellently cover the trench formed by recessing the isolation oxide film 20 in the memory cell area 210 formed in step (3). A metal film 34 is deposited on the second conductor film 32. As the metal film 34, it can be used, for example, tungsten silicide (WSi), cobalt silicide (CoSi), nickel silicide (NiSi), tungsten (W) or aluminum (Al). Further, a fifth insulator 36 is deposited on an entire surface of the metal film 34. As the fifth insulator 36, it can be used $SiO_2$ film or SiN film having a film thickness ranging from, e.g., 10 nm to 500 nm.

(6) Then, as shown in FIGS. 9A to 9D, the fifth insulator 36, the metal film 34 and the second conductor film 32 are being processed by lithography and etching to form a control gate electrode 130 of the non-volatile semiconductor storage element 100 and a electrode 230 of the resistance element 200.

Figure 9A:
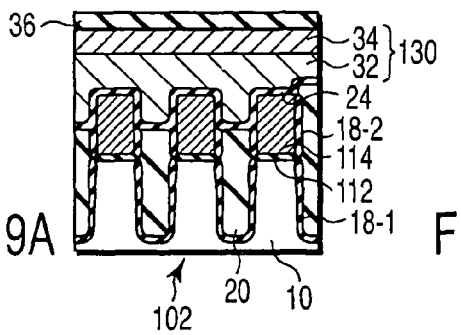
Figure 9B:
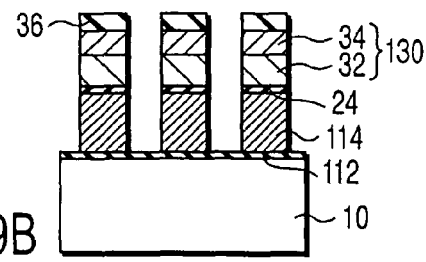
Figure 9C:
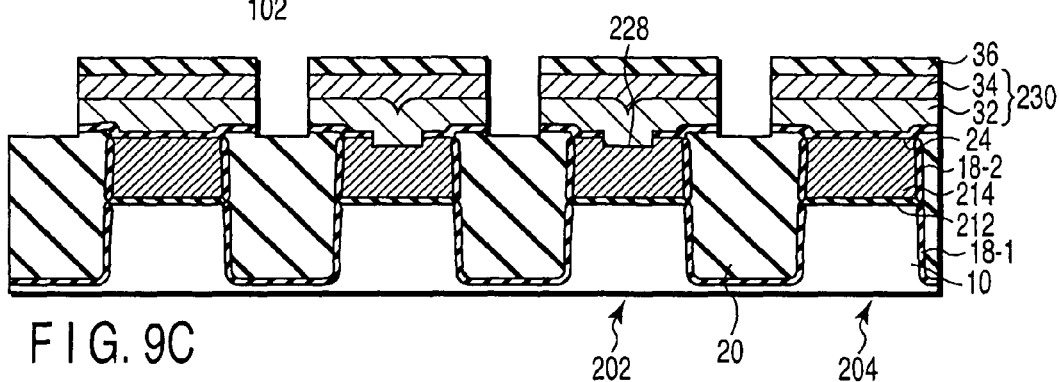

FIG. 9A is a cross-sectional view in a direction parallel to the control gate electrode 130 of the non-volatile semiconductor storage element 100 taken along the cutting-plane line in FIG. 1A, and FIG. 9B is a cross-sectional view in a direction orthogonal to the control gate electrode 130 taken along the cutting-plane line 2B-2B in FIG. 2A. FIG. 9C is a cross-sectional view in a direction cutting across the resistance element components 202 in the electrode section of the resistance element taken along the cutting line 3A-3A in FIG. 1B, and FIG. 9D is a cross-sectional view in a longitudinal direction of the resistance element component 202 taken along the cutting-plane line 3C-3C.

In the memory cell area 110, the fifth insulator 36, the metal film 34 and the second conductor film 32 are processed into a strip-like shape in such a manner that these members become long in a direction orthogonal to a direction along which the first conductor film 14 serving as the floating gate electrode 114 extends, thereby forming the control gate electrode 130. Furthermore, the fourth insulator and the first conductor film 14 at the exposed part are removed to form each independent floating gate electrode 114. As a result, a cross-point type memory cell can be formed. The cross-sectional structure of the memory cell shown in FIGS. 9A and 9B can be obtained in this manner.

In the resistance element area 210, the fifth insulator 36, the metal film 34 and the second conductor film 32 are processed by anisotropic etching to provide a dimension slightly larger than that of the first conductor layer 214 of the resistance element component 202 and the resistance dummy 204, e.g., a dimension expanded by, e.g., 0.02 μm to 0.5 μm, thereby forming the electrode 230 of the resistance element. In this etching, since the opening 228 is formed within the width of the first conductor film 214, all of the fourth insulator 24 remains in the exposed surface by the etching, thus effecting etching with the excellent evenness. In this processing, since the width of each of the resistance element component 202 and the resistance dummy 204 is sufficiently larger than the memory cell 102, lithography and etching having a high accuracy and a high resolution do not need to be performed like in the memory cell 102, and this processing can be performed by less expensive lithography and etching having a lower resolution which is different from those of the memory cell 102. If the width extended toward the outside from the first conductor layer 214 of the resistance element component 202 and the resistance dummy 204 at the electrode 230 part of the resistance element is larger than an accuracy of alignment with the first conductor layer 214, a capacitance between the electrode 230 of the resistance element and the first conductor layer 214 with the fourth insulator 24 sandwiched hardly varies. Therefore, the resistance element 200 with reduced variation in parasitic capacitance can be realized even if less expensive lithography is used. In the processing of the electrode 230 of the resistance element, the fourth insulator 24 does not need to be remained in the part removed by etching, and it can be used a structure in which the fourth insulator 24 is removed and the isolation insulator 20 under the fourth insulator 24 is slightly etched as shown in FIG. 9C.

Figure 9D:
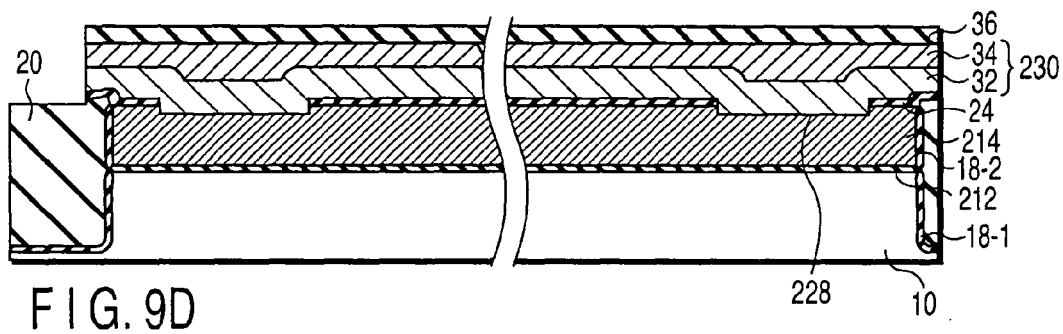

In this manner, the electrode 230 of the resistance element having the cross-sectional structure shown in FIGS. 9C and 9D can be obtained.

Figure 10A:
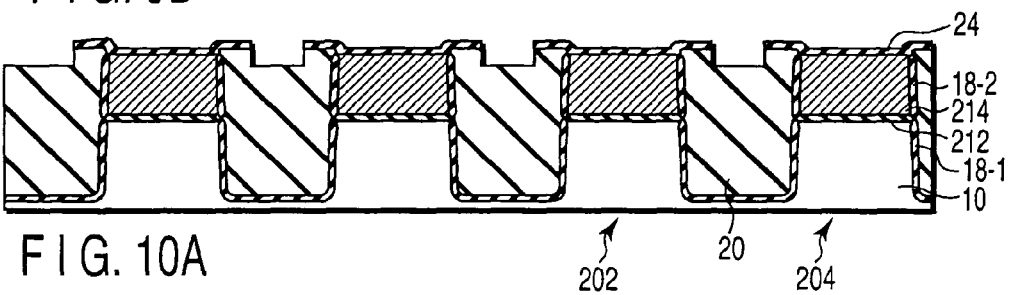
Figure 10B:
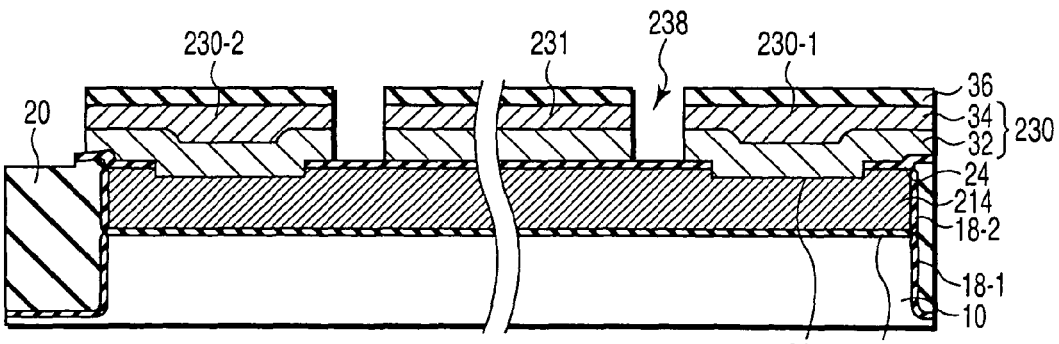

(7) Then, as shown in FIGS. 10A and 10B, electrode separation area 238 is being formed to divide the electrode 230 of the resistance element.

FIG. 10A is a cross-sectional view in a direction cutting across the resistance element components 202 in the electrode separation area 238 of the resistance element taken along the cutting-plane line 3B-3B in FIG. 1B, and FIG. 10B is a cross-sectional view in a longitudinal direction of the resistance element component 202 taken along the cutting-plane line 3C-3C in FIG. 1B.

The electrode separation area 238 is formed by lithography and etching to divide the electrodes 230 at a position on the inner side apart from the opening 228 in the lateral direction of the first conductor layer 214. The electrode separation area 238 is formed to transversely separate the plurality of the electrode 230 of the resistance elements arranged in parallel. The electrode 230 of the resistance element components 202 is divided into electrodes 230-1 and 230-2 at both ends and a second conductor layer 231 sandwiched between these electrodes by the electrode separation area 238 as shown in FIG. 10B.

A width of the electrode separation area 238 in the longitudinal direction of the resistance element components 202 can be set to, e.g., 50 nm to 1 μm. The resistance element 200 does not need to be designed with such a minimum design dimension as demanded in the memory cell, and the electrode separation area 238 can be formed by using a less expensive lithography device having a lower resolution as compared with that for forming the memory cell 102. Further, as shown in FIG. 10B, as the electrode separation area 238 is formed on the both sides at the position on the inner side apart from the opening 228 of the resistance element component 202 as described above, the second conductor layer 231 formed on the central area of the first conductor layer 214 serving as the high-resistance element can be set in an electrically floating state. As a result, a potential difference between the electrode 230 of the resistance element and the first conductor layer 214 can be maintained to be small as compared with a case of forming the electrode separation area 238 on one side in the inner side apart from one opening 228 of the resistance element component 202, thereby realizing the resistance element 200 having a higher breakdown voltage and a higher reliability.

Alternatively, in the etching of the electrode separation area 238, if an etching with a slower etching speed to $SiO_2$ film than that to the second conductor film 32 is applied, then the fourth insulator 24 can be remained in the electrode separation area 238. As a result, the fourth insulator 24 in the electrode separation area 238 is not removed by etching, and a film thickness of the first conductor layer 214 under the fourth insulator 24 is not reduced, thus realizing the resistance element 200 with the higher accuracy.

(8) Then, as shown in FIGS. 11A to 11D, a contact 242 and a wiring 244 are being formed.

FIG. 11A is a cross-sectional view in a direction parallel to the control gate electrode 130 of the non-volatile semiconductor storage element 100 taken along the cutting-plane line 2A-2A in FIG. 1A, and FIG. 11B is a cross-sectional view in a direction orthogonal to the control gate electrode 130 taken along the cutting-plane line 2B-2B in FIG. 1A. FIG. 11C is a cross-sectional view in a direction cutting across the resistance element components 202 in the electrode section of the resistance element taken along the cutting-plane line 3A-3A in FIG. 1B, and FIG. 11D is a cross-sectional view in a longitudinal direction of the resistance element component 202 taken along the cutting-plane line 3C-3C in FIG. 1B.

Referring to FIGS. 11A to 11D, an interlevel dielectric 40 is deposited on an entire surface in a film thickness ranging from, e.g., 100 nm to 1 μm, and then the interlevel dielectric 40 is planarized by, e.g., CMP. As the interlevel dielectric 40, it can be used, e.g., $SiO_2$ film, silicate glass, such as BPSG, BSG or PSG, or a low-dielectric-constant insulator, e.g., HSQ or MSQ.

Then, a contact hole 242h reaching to the electrode 230 of the resistance element is formed in the interlevel dielectric 40 above the opening 228. Furthermore, a wiring trench 244t is formed in the interlevel dielectric 40. The contact hole 244h has a diameter of, e.g., 20 nm to 200 nm. The wiring trench 244t has a width of, e.g., 50 nm to 500 nm.

Then, a barrier metal (e.g., Ti, TiN or TaN) (not shown) and a wiring metal such as tungsten or copper are deposited on an entire surface including the inside of the contact hole 242h and the wiring trench 244t. The barrier metal and the wiring metal deposited on the interlevel dielectric 40 are removed by, e.g., CMP and planarized, thereby forming a contact 242 and a wiring 244 shown in FIGS. 11C and 11D.

As shown in FIG. 1B, in the resistance element 200, the electrodes 230-2, shown on the lower side in the drawing, of the two adjacent resistance element components 202 arranged at the center are connected with the wiring 244-2 through the contact 242-2. By providing the wiring having such a folded structure, it can be realized a high-resistance element 200 with a high reliability which allows to divide a high voltage of 20V or above to lower voltages while setting a voltage applied to one resistance element component 202 to, e.g., 5V or below and maintaining a voltage applied between the electrode 230 of the resistance element and the first conductor layer 214 at a sufficiently low voltage.

Thereafter, steps required for the semiconductor device such as multilevel wiring are carried out to complete the semiconductor device comprising the non-volatile semiconductor storage element 100 and the resistance element 200.

The thus formed resistance element 200 can reduce relative variation in resistance since variation in the processing dimension can be reduced. If the resistance element is used for a delay generation circuit of a circuitry, a margin in delay required to compensate variations in resistance can be eliminated. As a result, the delay circuit with a higher speed and higher accuracy can be realized, thereby achieving a circuitry having a higher speed.

Moreover, for the resistance element 200 according to the present embodiment, it can be used a polycrystal silicon in a degenerated electronic state obtained by doping phosphorous at a high concentration of $10^{19}$ cm$^{-3}$ or more. As a result, variation in resistance due to temperature change can be reduced as compared with the resistance element 200 using a metal or a diffusion layer formed in the semiconductor substrate, thus the resistance element 200 having a higher accuracy and less variation in temperature can be realized.

As described above, according to the present embodiment, it can be rationally realized the semiconductor device comprising the resistance element with a high resistance and high resistance accuracy and the non-volatile semiconductor storage element even if design rule is shrunk.

Second Embodiment

According to a second embodiment of the present invention, there is provided a semiconductor device in which a floating gate electrode of a non-volatile semiconductor storage element and a first conductor layer of a resistance element are constituted of two layers, i.e., a third conductor film and a fourth conductor film is formed in a trench produced between isolation insulators. According to the semiconductor device of the present embodiment, since a width of the fourth conductor film of the floating gate electrode in a memory cell can be increased as compared with a width of the first conductor film of the first embodiment, a capacitance between the floating gate electrode and the control gate electrode can be increased.

Figures 12A, 12B, 12C, 12D:
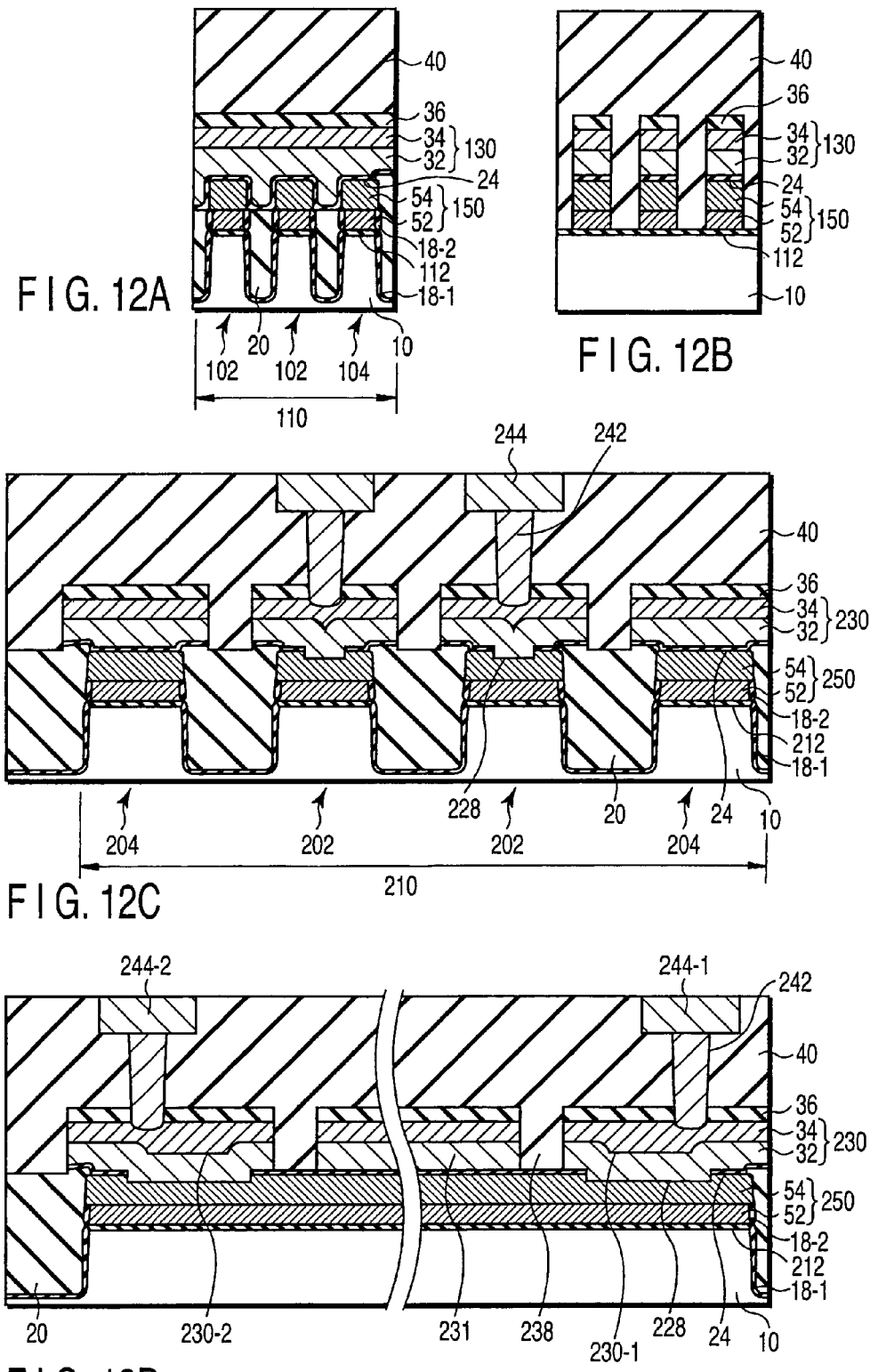

FIGS. 12A to 12D show an example of a cross-sectional structure of the semiconductor device according to the present embodiment. The plane views of the embodiment are eliminated since they are the same as those of the first embodiment. FIG. 12A is a cross-sectional view in a direction parallel to the control gate electrode 130 of the non-volatile semiconductor storage element 100 taken along the cutting-plane line 2A-2A in FIG. 1A, and FIG. 12B is a cross-sectional view in a direction orthogonal to the control gate electrode 130 taken along the cutting-plane line 2B-2B in FIG. 1A. FIG. 12C is a cross-sectional view in a direction cutting across the resistance element components 202 in the electrode section of the resistance element taken along the cutting-plane line 3A-3A in FIG. 1B, and FIG. 12D is a cross-sectional view in a longitudinal direction of the resistance element component 202 taken along the cutting-plane line 3C-3C in FIG. 1B.

As described above, the floating gate electrode 150 of the non-volatile semiconductor storage element 100 and the first conductor layer 250 of the resistance element 200 are formed as a two-layered structure including a third conductor film 52 and a fourth conductor film 54. Additionally, similar to the first embodiment, the floating gate electrode 150 of the non-volatile semiconductor storage element 100 and the first conductor layer 250 of the resistance element 200 with a high-resistance are constituted of the same third and fourth conductor films 52 and 54. Likewise, a control gate electrode 130 of the non-volatile storage element 100 and an electrode 230 of the resistance element are formed of the same laminated film including a second conductor film 32 and a metal film 34. Further, an isolation 20 between a semiconductor substrate 10 in the non-volatile semiconductor storage element area 110 or the resistance element area 210 and the memory cells 102 or the resistance element components 202 formed on the semiconductor substrate is formed in a self-aligned manner by a single lithography and etching. That is, the third and fourth conductor films 52 and 54, the first or second insulator 112 or 212 on the semiconductor substrate and the semiconductor substrate 10 are simultaneously processed in the self-aligned manner to simultaneously form the isolation 20 in the memory cell 102 or the resistance element component 202 and the isolation 20 in the semiconductor substrate 10.

According to the present embodiment, similar to the first embodiment, the lithography having a high accuracy and high resolution can be used for forming the isolation 20 of the first conductor layer 250 having a high resistance in the resistance element 200 by using the same lithography and etching as the isolation 20 of the non-volatile storage element 100. Therefore, there can be obtained an advantage that a line width of the first conductor layer 250 having a high resistance can be finely formed and a variation in the line width can also be reduced. As a result, an area of the first conductor layer 250 of the resistance element 200 from which a high resistance is to be obtained can be reduced, thus decreasing an area of the semiconductor device.

An example of a manufacturing process of the semiconductor device according to the present embodiment will now be described hereinafter with reference to FIGS. 13A to 17D. Each drawing A of FIGS. 13A to 16A is a cross-sectional view of the non-volatile semiconductor element in a direction parallel to the control gate electrode 130 taken along the cutting-plane line 2A-2A in FIG. 1A, each drawing B of FIGS. 13B to 16B is a cross-sectional view of the resistance element 200 in a direction cutting across the resistance element components 202 in the electrode section of the resistance element taken along the cutting-plane line 3A-3A in FIG. 1B, and each drawing C of FIGS. 13C to 16C is a cross-sectional view in a longitudinal direction of the resistance element component 202 taken along the cutting-plane line 3C-3C in FIG. 1B.

(1) First, as shown in FIGS. 13A to 13C, a third conductor film 52 is being deposited on a semiconductor substrate 10, e.g., a silicon substrate, via a first or a second insulator 112 and 212, then an isolation trench 20t is being formed in the third conductor film 52 and the silicon substrate 10 to form an isolation therein in a self-aligned manner.

Since this step is substantially the same as the step (1) in the first embodiment, the detailed explanation will be eliminated. A difference from the first embodiment lies in that the third conductor film 52 which is used in place of the first conductor film 14 has a thinner film thickness and that a cap insulator 16 has a thicker film thickness. The third conductor film 52 is formed of polycrystal silicon or SiGe having a film thickness ranging from, e.g., 20 nm to 100 nm and a cap insulator 16 is SiN film or $SiO_2$ film having a film thickness ranging from 120 nm to 400 nm.

A cap insulator 16, the third conductor film 52, the first or second insulator 112 or 212 and the silicon substrate 10 in an area where the isolation is being formed are sequentially etched so that the isolation trench 20t, 20tR is formed in the third conductor film 52, the first or second insulator 112 or 212 and the silicon substrate 10 in a self-aligned manner.

A plurality of resistance element components 202 and at least two resistance dummies 204 having the same element width and isolation trench width are formed in a resistance element area 210. A width and an interval of each isolation trench 20tR in the resistance element area 210 are sufficiently larger than values of each isolation trench 20t in a memory cell area 110. A change in resistance due to variation in dimension can be reduced since the resistance element is processed by the same lithography with the memory cell having a higher accuracy. In this example, the third conductor film 52 of the resistance dummy 204 is formed with the same width in parallel with the third conductor film 52 of the resistance element components 202, and has a function to prevent from causing a variation in dimension due to unevenness of a pattern in the resistance element 200 and make the resistance element 200 to have more uniform width.

In formation of the isolation trench 20t and 20tR, the third conductor film 52 and the silicon substrate 10 are processed in the self-aligned manner, and it is preferable that a corner of the processed third conductor film 52 serving as a part of the floating gate electrode 150 and a part of the first conductor layer 250 has a shape not to fall in toward the silicon substrate 10.

In this manner, the isolation trench 20t and 20tR, the floating gate electrode 150 or the first conductor layer 250 being formed from the third conductor film 52 and the silicon substrate 10 are processed in the self-aligned manner, thereby forming the cross-sectional structure shown in FIGS. 13A to 13C.

Figure 14A:
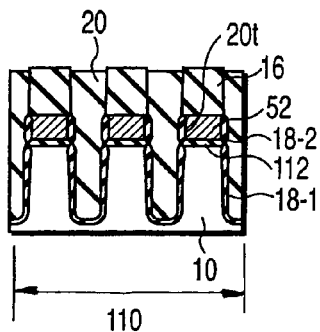
Figure 14B:
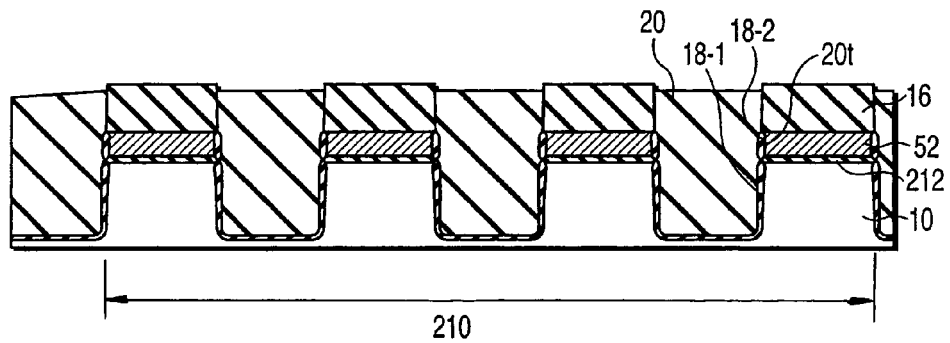
Figure 14C:
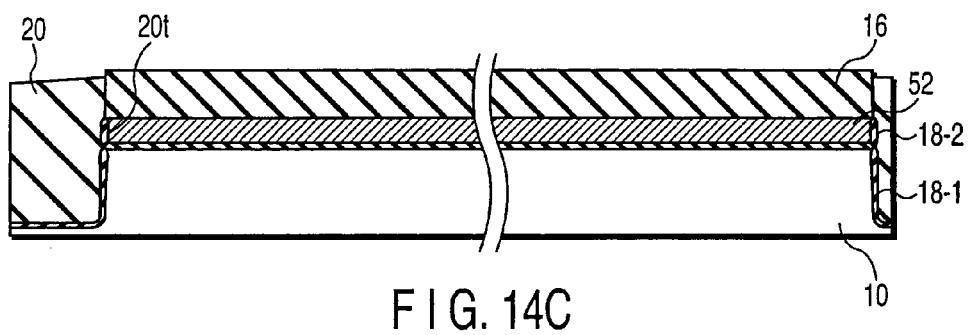

(2) Then, as shown in FIGS. 14A to 14C, an isolation 20 is being formed by the same step as the step (2) of the first embodiment.

That is, third insulators 18-1 and 18-2 are formed on the inner wall of the isolation trench 20t as required, and an isolation insulator 20 which is an insulator such as HTO, HDP or PSZ is deposited and planarized by CMP.

In this way, as shown in FIGS. 14A to 14C, the cap insulator 16, the third conductor film 52 of the floating gate electrode 150 or the first conductor layer 250 and the semiconductor active area in the silicon substrate 10 can be formed in the self-aligned manner with the isolation 20.

Figure 15A:
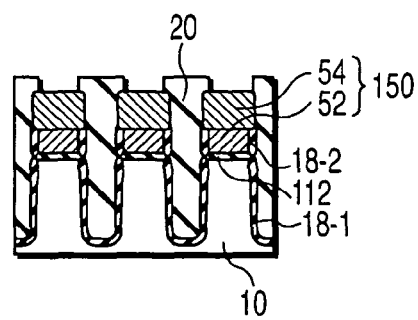
Figure 15B:
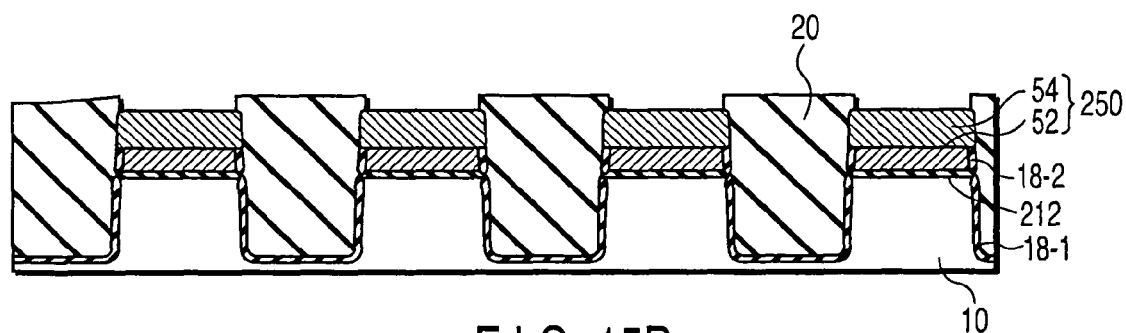
Figure 15C:
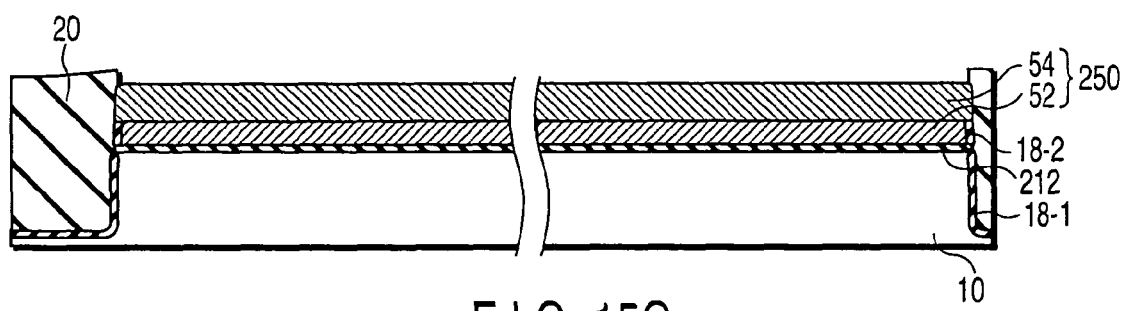

(3) Next, as shown in FIGS. 15A to 15C, a fourth conductor film 54 which becomes a part of the floating gate electrode 150 and a part of the first conductor layer 250 is being formed in the trench on the third conductor film 52 formed by removing the cap insulator 16.

Specifically, referring to FIGS. 15A to 15C, for example, SiN film as the cap insulator 16 is removed to form a trench surrounded by the isolation insulator 20 on the third conductor film 52. For example, if the cap insulator 16 is SiN film, only the cap insulator 16 can be readily removed by using, e.g., a chemical liquid such as hot phosphoric acid.

Then, a fourth conductor film 54 is entirely or selectively formed to fill the trench on the third conductor film 52. The fourth conductor film 54 is a polycrystal silicon or SiGe film having a film thickness ranging from, e.g., 60 nm to 400 nm. Furthermore, the fourth conductor film 54 is planarized by, e.g., CMP with an upper surface of the isolation insulator 20 being used as an etching stopper. As a result, the fourth conductor film 54 is embedded in the isolation insulator 20 in a self-aligned manner, and a surface of the fourth conductor film 54 is slightly lower than the upper surface of the isolation insulator 20. Consequently, as shown in the cross-sectional views of FIGS. 15A to 15C, the third and fourth conductor films 52 and 54 serving as the floating gate electrode 150 or the first conductor layer 250 having the two-layered structure can be formed. Moreover, in this structure, a width of the fourth conductor film 54 can be made larger than a width of the third conductor film 52. As a result, a capacitance between the floating gate electrode 150 and the control gate electrode formed thereon can be made larger than that of the first embodiment.

Figure 16A:
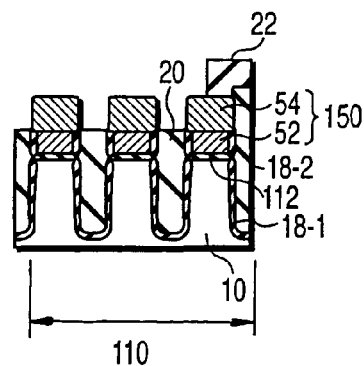
Figure 16B:
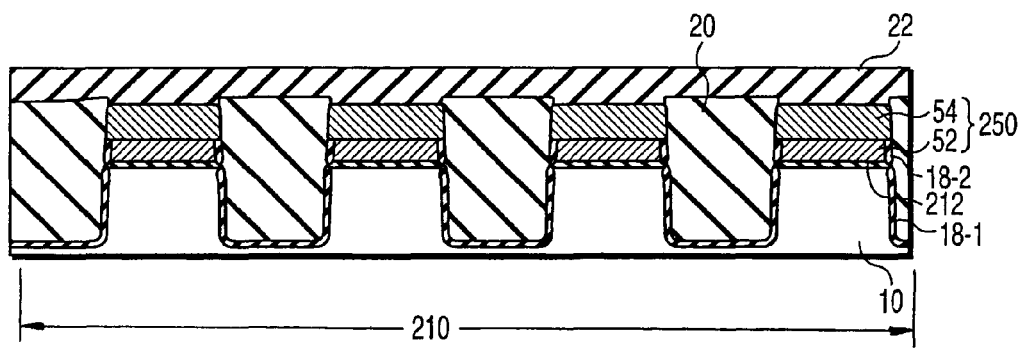
Figure 16C:
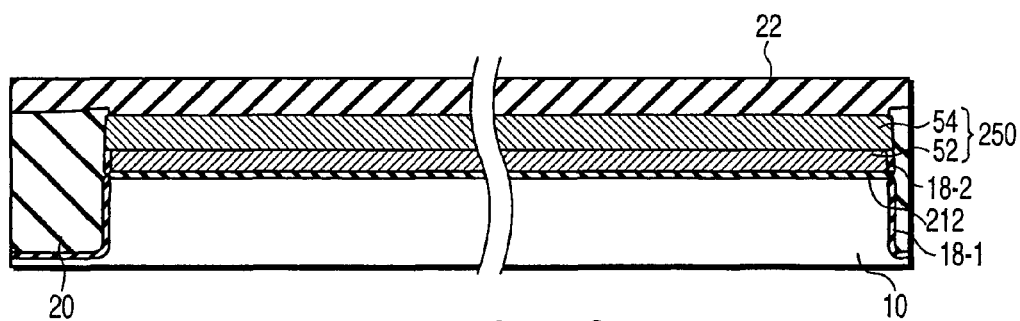
Figure 17A:
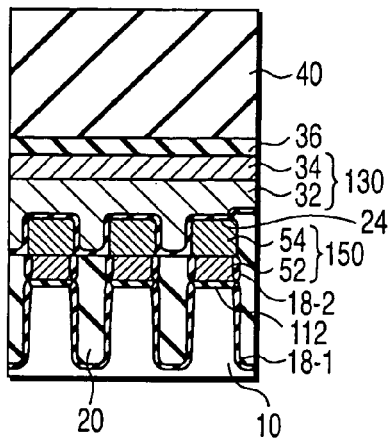
Figure 17B:
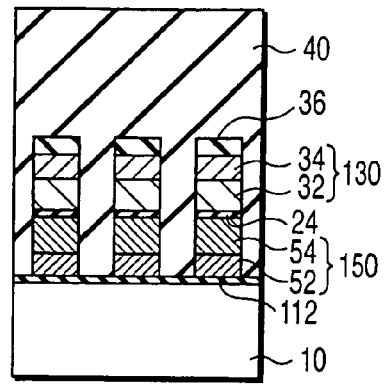
Figure 17C:
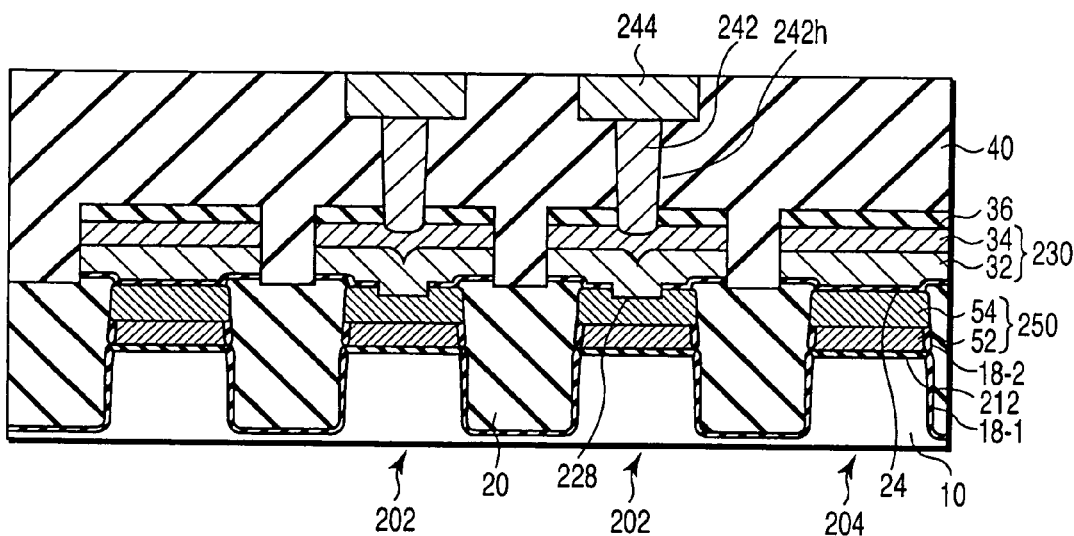
Figure 17D:
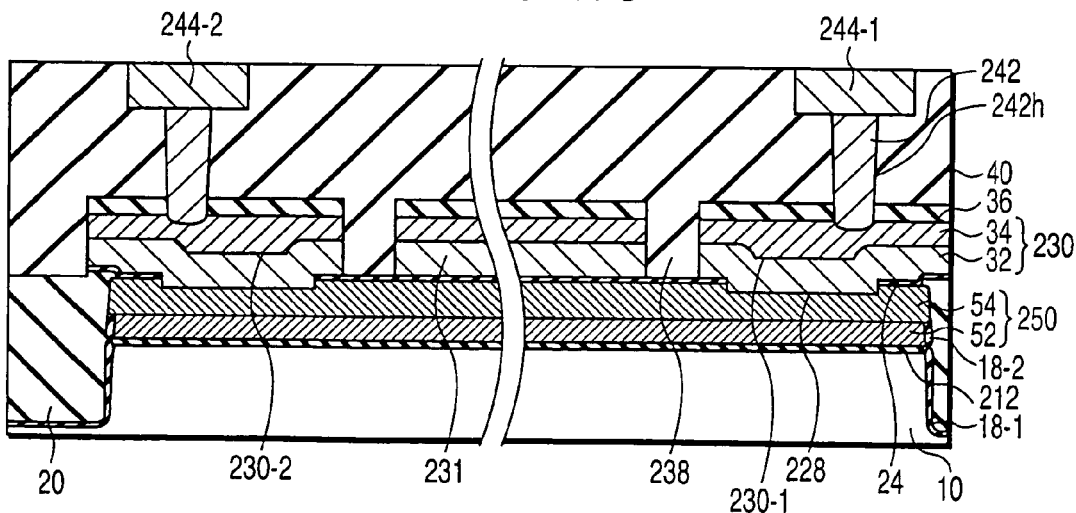

(4) Then, as shown in FIGS. 16A to 16C, the isolation insulator 20 in the memory cell area is being recessed to a desired height.

Since this step is substantially the same as the step (3) in the first embodiment, the detailed explanation will be eliminated. It is to be noted that the height of the isolation insulator 20 is not lower than a height of a boundary between the third conductor film 52 of the floating gate electrode 150 and a tunnel insulator (the first insulator) 112. By exposing the upper surface and the side surface of the floating gate electrode 150 in this manner, an area in which the floating gate electrode 150 of the memory cell comes into contact with the control gate electrode 130 (not shown) being formed later can be increased, namely, a capacitance between the floating gate electrode 150 and the control gate electrode 130 can be increased as compared with that in case of exposing the upper surface of the floating gate electrode 150 alone. Thus the memory cell with a higher reliability can be thereby formed even if the fourth insulator (not shown) with a lower breakdown voltage is used between the floating gate electrode 150 and the control gate electrode 130. It is to be noted that the isolation insulator 20 in the resistance element area 210 is not etched back in this step.

In this way, it can be formed the structure shown in FIG. 16A in which the isolation insulator 20 in the memory cell area is recessed to a desired height.

Thereafter, the same processing as the steps (4) to (8) of the first embodiment is performed to form a fourth insulator (e.g., an ONO film) on the floating gate electrode 150 and the first conductor layer 250, provide openings 228 to the fourth insulator at the both ends of the resistance element 200, form a control gate electrode 130 and an electrode 230 of the resistance element, form an electrode separation area 238, and form a contact 242 and a wiring 244 in an interlevel dielectric 40, thereby bringing the structure shown in FIGS. 17A to 17D to completion.

Thereafter, steps required for the semiconductor device such as multilevel wiring are carried out to complete the semiconductor device comprising the non-volatile semiconductor storage element 100 and the resistance element 200.

The thus formed resistance element 200 can reduce relative variation in resistance like in the first embodiment, since variation in the processing dimension can be reduced. If the resistance element is used for a delay generation circuit of a circuitry, a margin in delay required to compensate variations in resistance can be eliminated. As a result, the delay circuit with a higher speed and higher accuracy can be realized, thereby achieving a circuitry having a higher speed.

Moreover, in the semiconductor device according to the present embodiment, since a width of the fourth conductor film of the floating gate electrode in the memory cell can be made larger than a width of the first conductor film in the first embodiment, a capacitance between the floating gate electrode and the control gate electrode can be increased as compared with the semiconductor device according to the first embodiment.

As described above, according to this embodiment, it can be rationally realized the semiconductor device comprising the resistance element with a high resistance and high resistance accuracy and the non-volatile semiconductor storage element even if design rule is shrunk.

Third Embodiment

According to a third embodiment of the present invention, there is provided a semiconductor device in which a floating gate electrode of a non-volatile semiconductor storage element and a first conductor layer of a resistance element are formed in a trench produced between isolation insulators. In the semiconductor device according to the present embodiment, since a width of the floating gate electrode can be increased in a memory cell as compared with the semiconductor devices according to the first and second embodiments, a capacitance between the floating gate electrode and a control gate electrode can be increased. As a result, a sufficient coupling ratio can be obtained even if a film thickness of the floating gate electrode is reduced.

Figure 18A:
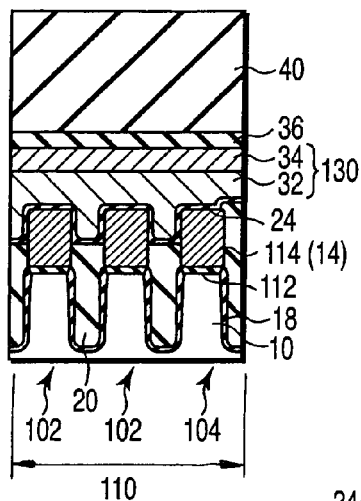
Figure 18B:
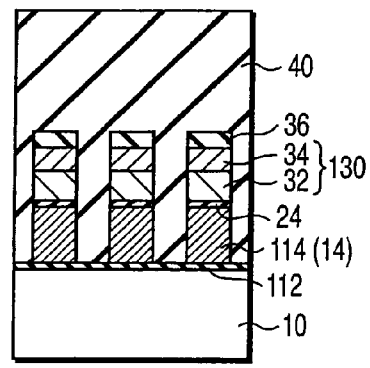
Figure 18C:
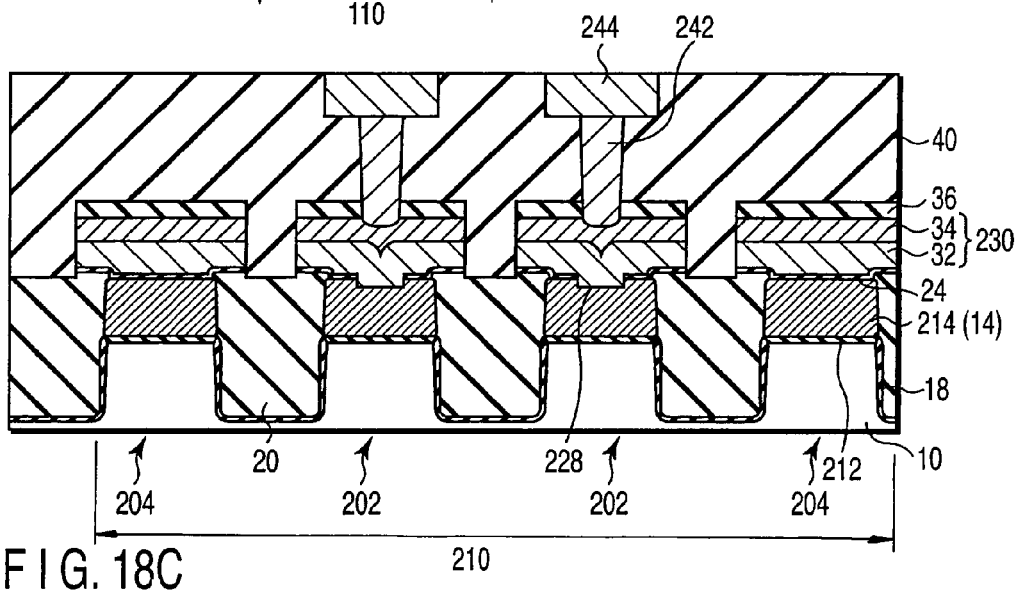
Figure 18D:
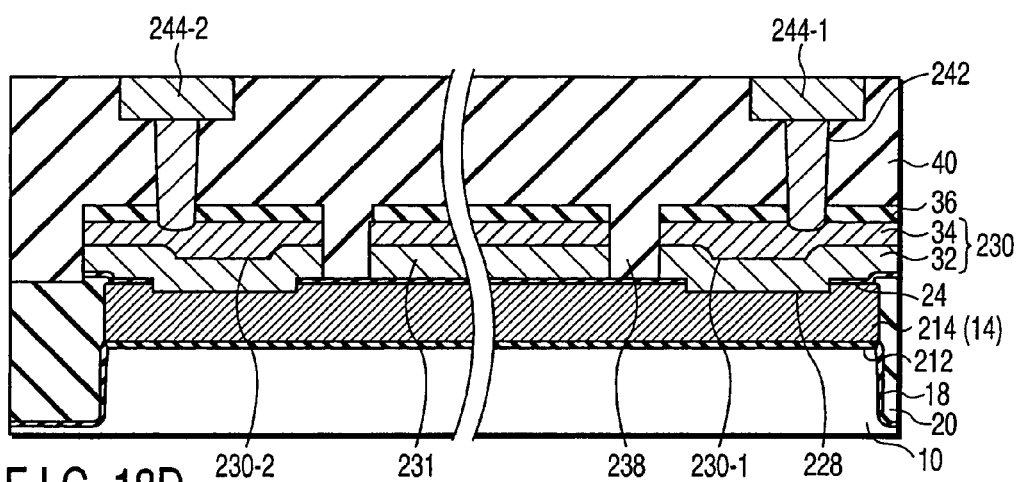

FIGS. 18A to 18D show an example of a cross-sectional structure of the semiconductor device according to the present embodiment. Since the plane structure of the embodiment is the same as that of the first embodiment, thereby eliminating the explanation thereof. FIG. 18A is a cross-sectional view in a direction parallel to a control gate electrode 130 of a non-volatile semiconductor storage element 100 taken along the cutting-plane line 2A-2A in FIG. 1A, and FIG. 18B is a cross-sectional view in a direction orthogonal to the control gate electrode 130 taken along the cutting-plane line 2B-2B in FIG. 1A. FIG. 18C is a cross-sectional view in a direction cutting across resistance element components 202 in an electrode section of the resistance element taken along the cutting-plane line 3A-3A in FIG. 1B, and FIG. 18D is a cross-sectional view in a longitudinal direction of the resistance element component 202 taken along the cutting-plane line 3C-3C in FIG. 1B.

Like the first and second embodiments, according to the embodiment, a floating gate electrode 114 of the non-volatile semiconductor storage element 100 and a first conductor layer 214 with a high resistance of the resistance element 200 are constituted of the same first conductor film 14. Likewise, the control gate electrode 130 of the non-volatile semiconductor storage element 100 and the electrode 230 of the resistance element are constituted of the same laminated film including a second conductor film 52 and a metal film 54.

Further, isolations 20 in the semiconductor substrate 10 in the non-volatile semiconductor storage element area 110 or the resistance element area 210 and isolations 20 between the memory cells 102 or between the resistance element components 202 each formed on the semiconductor substrate are simultaneously formed in a self-aligned manner by one operation of lithography and etching. That is, the isolations 20, which separates the semiconductor substrate 10 and protrudes from the substrate, is formed, and the first conductor film 14 is embedded in a trench between the isolations 20. As a result, the isolations 20 of the memory cells 102 or the resistance element components 202 on the substrate are formed in the self-aligned manner with the isolations 20 in the semiconductor substrate 10. By forming the isolation 20 in a self-aligned manner, the floating gate electrode 214 and the first conductor layer 214 are formed in such a manner that their corners do not fall in a direction towards the substrate 10. Furthermore, in this manufacturing process, the lithography with a high accuracy and high resolution can be applied for processing the resistance element 200. Therefore, there can be obtained an advantage that a line width of the first conductor layer 214 of the resistance element 200 can be finely formed and the variation in the dimension can be also decreased. Consequently, an area of the first conductor layer 214 of the resistance element 200 to be formed as a high resistance can be reduced, thereby an area of the semiconductor device is decreased.

An example of a manufacturing process of the semiconductor device according to the present embodiment will now be described hereinafter with reference to FIGS. 19A to 22D. Each drawing A of FIGS. 19A to 21A is a cross-sectional view of the non-volatile semiconductor storage element 100 in a direction parallel to the control gate electrode 130 taken along the cutting-plane line 2A-2A in FIG. 1A, each drawing B of FIGS. 19B to 21B is a cross-sectional view of the resistance element 200 in a direction cutting across the resistance element components 202 in the electrode section of the resistance element taken along the cutting-plane line 3A-3A in FIG. 1B, and each drawing C of FIGS. 19C to 21C is a cross-sectional view in a longitudinal direction of the resistance element component 202 taken along the cutting-plane line 3C-3C in FIG. 1B.

Figure 19A:
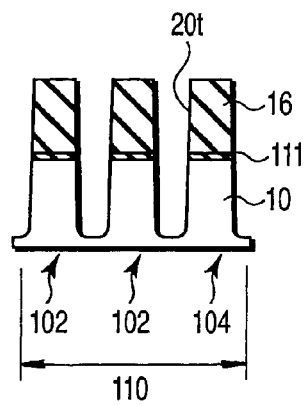
FIGS. 19A to 22D are views illustrating an example of a manufacturing process of the semiconductor device according to the third embodiment of the present invention.
Figure 19B:
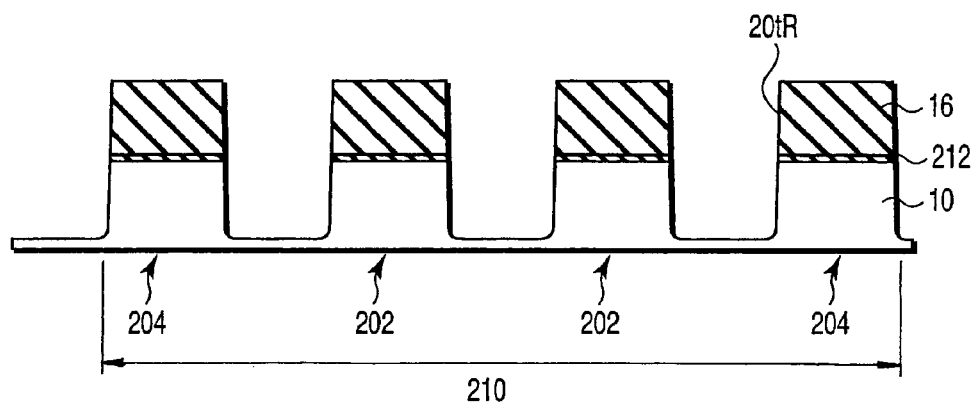
Figure 19C:
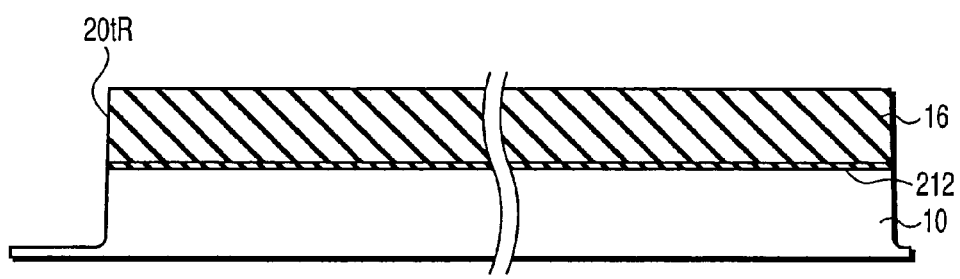

(1) First, as shown in FIGS. 19A to 19C, a pad oxide film 111, a second insulator 212 and a cap insulator 16 are being formed on a semiconductor substrate 10, e.g., a silicon substrate, and an isolation trench 20t which is used to form an isolation protruding from the silicon substrate 10 is formed in the cap insulator 16 and the silicon substrate 10 in a self-aligned manner.

This step is substantially the same as the step (1) of the first embodiment, thereby eliminating the detailed explanation thereof. A difference from the first embodiment lies in that the pad insulator 111 is formed on the silicon substrate 10 in the memory cell area 110 and the thick cap insulator 16 is formed without forming the first conductor film after formation of the pad insulator 111 and the second insulator 212. The pad insulator 111 formed in the memory cell area 110 is removed before forming the first conductor film 14 in a later step and replaced with a first insulator 112 which is a tunnel insulator. As the pad insulator 111, it can be used SiO$_2$ film or SiON film having a film thickness ranging from, e.g., 4 nm to 12 nm. As the cap insulator 16, it can be used a thick SiN film or SiO$_2$ film having a film thickness of a range from, e.g., 120 nm to 500 nm. The cap insulator is replaced with a first conductor film 14 in a later step.

First, the pad insulator 111 or the second insulator 212 and the cap insulator 16 are sequentially deposited on the silicon substrate 10. The cap insulator 16, the pad insulator 111 or the second insulator 212, and the silicon substrate 10 in an area where an isolation is being formed are sequentially etched so that an isolation trench 20*t* is formed on and in the silicon substrate 10 in a self-aligned manner. A depth of the isolation trench 20*t* formed in the silicon substrate 10 falls within a range from, e.g., 100 nm to 400 nm.

A plurality of resistance element components 202 and at least two resistance dummies 204 disposed at both sides are formed with the same element width and isolation trench width in the resistance element area 210. Although a width and an interval of the isolation trench 20*t*R in the resistance element area 210 are sufficiently larger than those in the memory cell area 110, since processing is performed by the same lithography as in the memory cell with a high accuracy, variations in dimension can be controlled small, thereby reducing a fluctuation in resistance due to variations in dimension. In this example, the resistance dummies 204 are formed with the same width and in parallel with the resistance element components 202 in order to prevent from causing a dimensional variation in the lithography due to the unevenness in pattern in the resistance element are 210 and form the width of the resistance element components 202 more uniform.

In this manner, isolation trench 20*t* shown in FIGS. 19A to 19C can be formed on and in the silicon substrate 10 in a self-aligned manner.

Figure 20A:
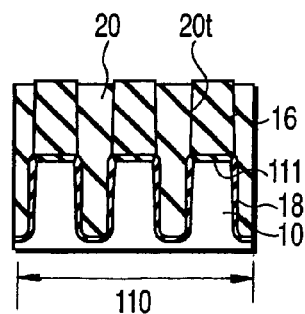
Figure 20B:
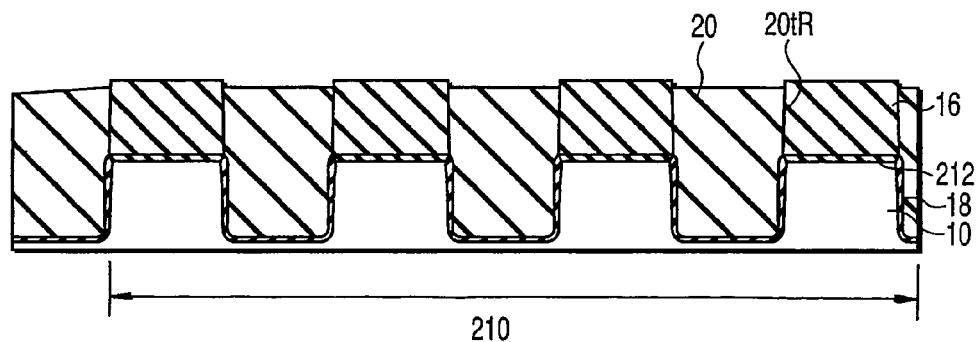
Figure 20C:
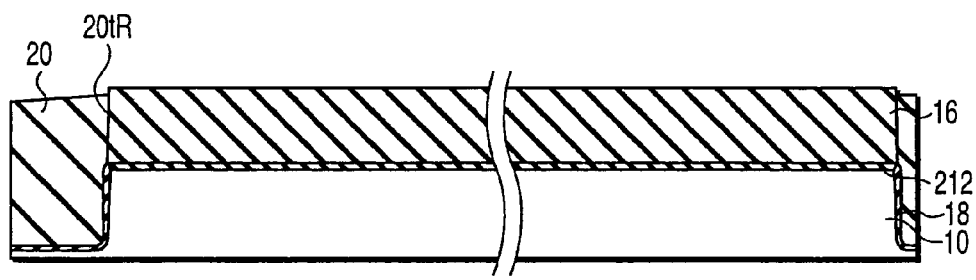

(2) Then, as shown in FIGS. 20A to 20C, the isolation 20 is being formed in the same manner as the step (2) of the first embodiment.

That is, a third insulator 18 is formed on the surface of the silicon substrate 10 in the isolation trench 20*t* as required, and an isolation insulator 20, e.g., an HTO film, is deposited on an entire surface and planarized by CMP. The surface of the isolation insulator 20 is recessed to a position slightly lower than a surface of the cap insulator 16 in the CMP.

In this manner, as shown in FIGS. 20A to 20C, the isolations 20 protruding from the silicon substrate 10 can be formed to isolate the floating gate electrodes 114 or the first conductor layers 214 of the resistance element 200 and the semiconductor active area of the silicon substrate 10 in a self-aligned manner.

Figure 21A:
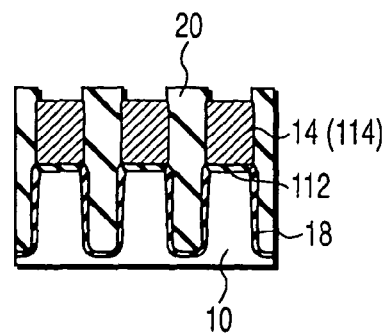
Figure 21B:
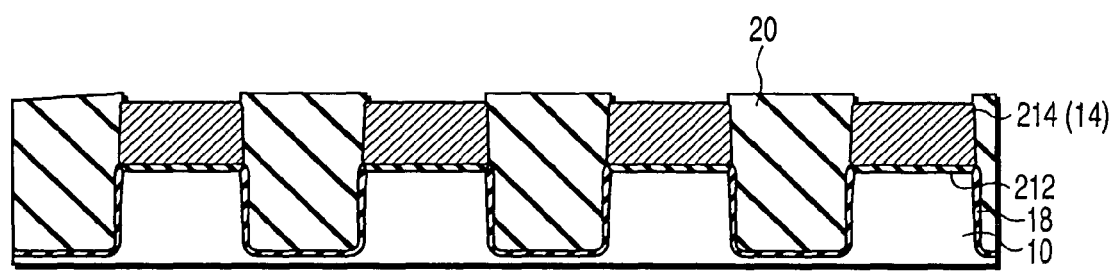
Figure 21C:
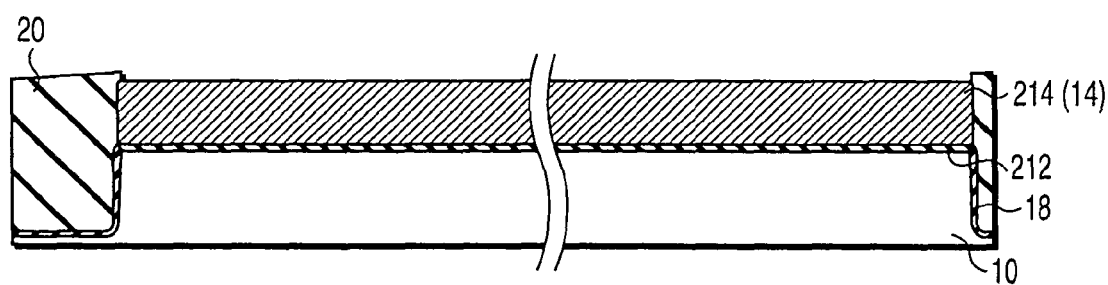
Figure 22A:
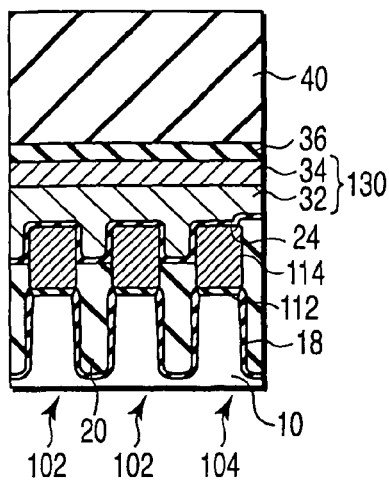
Figure 22B:
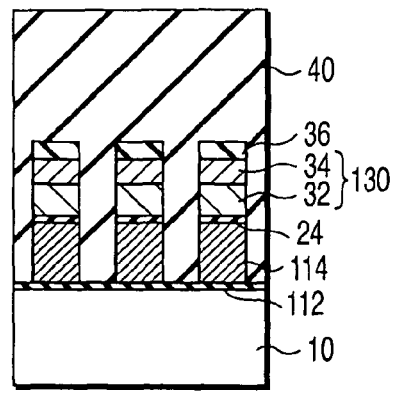
Figure 22C:
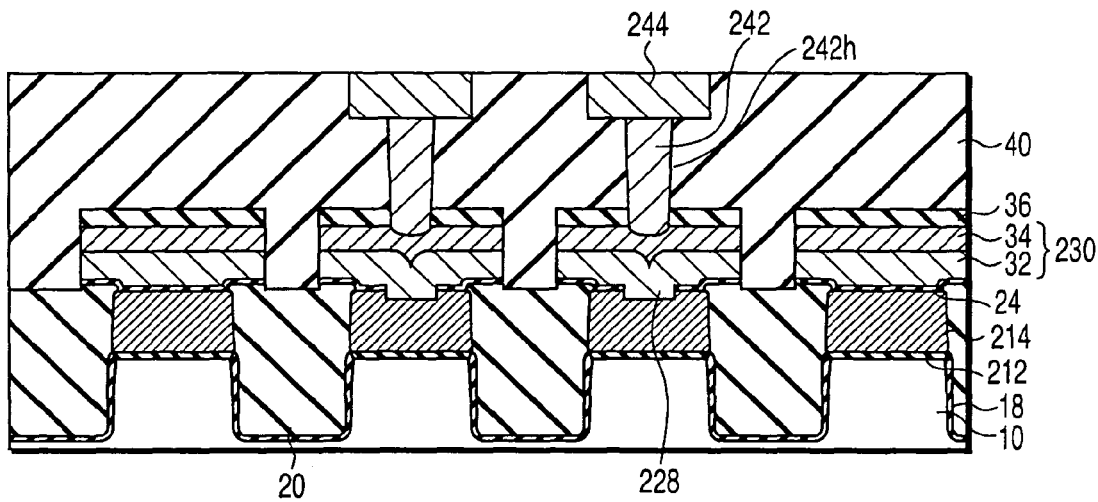
Figure 22D:
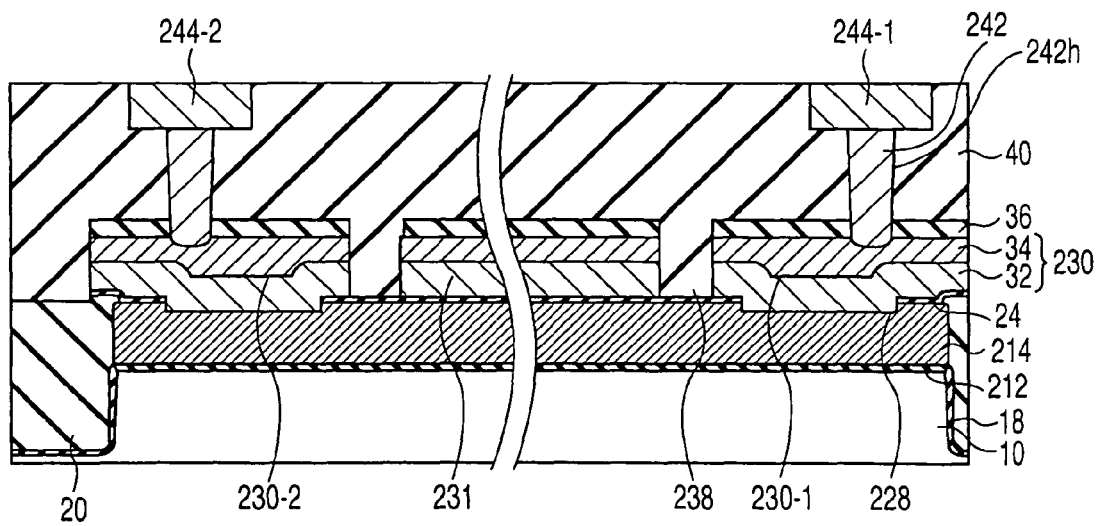

(3) Then, as shown in FIGS. 21A to 21C, the cap insulator 16 is being removed, and a first conductor film 14 which becomes a floating gate electrode 114 and a first conductor layer 214 is being formed in a thus formed trench surrounded by the isolation insulator 20.

Specifically, referring to FIGS. 21A to 21C, the trench surrounded by the isolation insulator 20 is formed on the silicon substrate 10 by removing the cap insulator 16, e.g., SiN film. For example, if the cap insulator 16 is SiN film, the cap insulator 16 alone can be readily removed by using a chemical liquid such as hot phosphoric acid.

Then, the pad insulator 111 in the memory cell area 110 is removed by using, e.g., a dilute hydrofluoric acid or ammonium fluoride solution. At this time, the isolation insulator 20 and the third insulator 18 are partially etched, and a width of the trench becomes wider than a width of the semiconductor active area of the silicon substrate 10 by, e.g., 1 nm to 20 nm. Then, a first insulator 112 which becomes a tunnel insulator of the memory cell 102 is formed with a film thickness ranging from, e.g., 4 nm to 12 nm. As the first insulator 112, SiO$_2$ film or SiON film can be used, for example.

Subsequently, a first conductor film 14 is selectively or entirely formed to fill the trench surrounded by the isolation insulator 20. The first conductor film 14 is formed of, e.g., polycrystal silicon or SiGe having a film thickness ranging from 60 nm to 400 nm. Then, the first conductor film 14 is planarized by, e.g., CMP with an upper surface of the isolation insulator 20 being used as a stopper. As a result, the first conductor film 14 is embedded in the isolation insulator 20 in a self-aligned manner and the surface of the first conductor film 14 is slightly recessed from the upper surface of the isolation insulator 20. By forming the first conductor film 14 in this manner, the miniaturization of the memory cells can be realized, and the first conductor film 14 which becomes the floating gate electrode 14 can be formed in such a manner that it does not cover the corner of the active area of the silicon substrate 10, thereby suppressing variation in memory cell characteristics due to the effect of the electric field concentration. Additionally, since the first conductor layer 214 of the resistance element 200 is formed of the same first conductor film 14 as the floating gate electrode 114, the first conductor layer 214 can be likewise formed not to cover the corner of the second insulator 212 on the active area of the semiconductor substrate provided under the first conductor layer 214, thereby suppressing a deterioration in breakdown voltage due to the electric field concentration or variation in capacitance characteristics.

In this manner, as shown in the cross-sectional views of FIGS. 21A to 21C, the first conductor film 14 which becomes the floating gate electrode 114 and the first conductor layer 214 can be formed in a self-aligned manner with the isolations 20. Furthermore, in this structure, a width of the first conductor film 14 can be made wider than a width of the active area of the silicon substrate 10. As a result, a capacitance between the floating gate electrode 114 and the control gate electrode 130 being formed thereon can be increased as compared with the first and second embodiments.

The same processing as the steps (3) to (8) of the first embodiment is thereafter carried out. That is, the isolation insulator 20 in the memory cell area 110 is recessed, a fourth insulator 24 (e.g., ONO film) is formed on the floating gate electrode 114 and the first conductor layer 214, openings 228 are provided to the fourth insulator 24 at both ends of the resistance element 200, a control gate electrode 130 and an electrode 230 of the resistance element are formed, an electrode separation area 238 is formed to the resistance element, and a contact 242 and a wiring 244 are formed in the interlevel dielectric 40, thereby bringing the structure shown in FIGS. 22A to 22D to completion.

Thereafter, steps required for the semiconductor device such as multilevel wiring are carried out to complete the semiconductor device comprising the non-volatile semiconductor storage element 100 and the resistance element 200.

The thus formed resistance element 200 can reduce relative variation in resistance like the first and second embodiments, since variation in the processing dimension can be reduced. If the resistance element is used for a delay generation circuit of a circuitry, a margin in delay required to compensate variations in resistance can be eliminated. As a result, the delay circuit with a higher speed and higher accuracy can be realized, thereby achieving a circuitry having a higher speed.

Furthermore, in the semiconductor device according to the present embodiment, since the width of the floating gate electrode in the memory cell can be made wider than that of the first and second embodiments, the capacitance between the floating gate electrode 114 and the control gate electrode 130 can be increased as compared with the semiconductor devices according to the first and second embodiments.

The present invention is not limited to the foregoing embodiments. For example, as the method for forming the isolation insulator or the insulator, it can be used any method other than the above-described method which converts silicon into a silicon oxide film or a silicon nitride film, e.g., a method which implants oxygen ions into deposited silicon film, a method which oxidizes deposited silicon and others. Moreover, as the fourth insulator 24 formed on the floating gate electrode 114, it can be used a titanium oxide film ($TiO_2$), an aluminum oxide film ($Al_2O_3$), a hafnium aluminum oxide film ($HfAlO_3$), a hafnium silicon oxide film ($HfSiO_2$), a tantalum oxide film ($Ta_2O_5$), a strontium titanate film ($SrTiO_3$), a barium titanate ($BTiO_3$), or a zirconium titanate lead film (PZT), or a laminated film formed of these members.

Although p-type Si substrate is used as the semiconductor substrate 10 in the embodiments, an n-type Si substrate or an SOI substrate can be used, and any other single-crystal semiconductor substrate including silicon, such as SiGe mixed crystal or SiGeC mixed crystal can be also utilized. Additionally, for the metal film 34 of the control gate electrode 130, it can be used the SiGe mixed crystal, the SiGeC mixed crystal, or silicide or polycide of, such as TiSi, NiSi, CoSi, TaSi, WSi or MoSi, a metal such as Ti, Al, Cu, TiN or W, or polycrystal silicon, or a laminated structure of these materials. Further, amorphous silicon, amorphous SiGe, amorphous SiGeC or a laminated structure including these materials can be used for the floating gate electrode 114 and/or the second conductor film 32 of the control gate electrode 130.

As described above, according to the structures of these embodiments of the present invention, the first conductor layer 214 of the resistance element 200 can be formed in the same layer with the floating gate electrode 114 of the non-volatile semiconductor storage element 100. Furthermore, the isolation of these floating gate electrodes 114 or the first conductor layer 214 can be simultaneously formed with the isolation in the active area of the semiconductor substrate 10 by using the same isolation 20, thereby the resistance element 200 having a high resistance and high resistance accuracy can be rationally realized with the non-volatile semiconductor storage element 100 even if design rule is shrunk. That is, the first conductor film 14, such as polycrystal silicon, with a resistivity higher than that of a metal can be processed by the same lithography and etching having a high accuracy and a high resolution as those for processing the active area of the semiconductor substrate so that the first conductor layer 214 which is a stripe-shaped resistance area can be formed simultaneously with the floating gate electrode 114. Therefore, since the highly accurate lithography can be used for the processing of the resistance element 200, there can be provided an advantage that a line width of the first conductor layer 214 can be reduced and a variation in the width can be also reduced. Consequently, an area of the first conductor layer 214 of the resistance element 200 from which a high resistance is to be obtained can be reduced, thereby decreasing a semiconductor chip area. Moreover, as the variation in the width can be reduced, a relative resistance variation can be reduced. If the resistance element is used for a delay generation circuit of a circuitry, a margin in delay required to compensate variations in resistance can be eliminated. As a result, the delay circuit with a higher speed and higher accuracy can be realized, thereby achieving a circuitry having a higher speed.

Furthermore, an additional highly accurate lithography with a high resolution for the resistance element which has been conventionally required separately from the lithography for isolation in the active area of the semiconductor substrate 10 is no longer necessary, which results in a reduction in a manufacturing process cost without increasing the number of accurate lithography steps.

As described above, according to the present invention, it can be provided the semiconductor device comprising the structure which rationally realizes the resistance element with a high resistance and high resistance accuracy and the non-volatile semiconductor storage element even if design rule is shrunk.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a non-volatile semiconductor storage element formed in a first semiconductor area of a semiconductor substrate; and
   a resistance element formed in a second semiconductor area of the semiconductor substrate,
   the non-volatile semiconductor storage element comprising:
   a first insulator formed on the semiconductor substrate in the first semiconductor area;
   a first electrode formed on the first insulator;
   a first isolation formed in a first trench provided in the semiconductor substrate to isolate a surface of the first semiconductor area, and contacting with a side surface of the first electrode;
   a second insulator formed on at least an upper surface of the first electrode; and
   a second electrode formed on the second insulator,
   the resistance element comprising:
   a second isolation formed in a second trench provided in the semiconductor substrate to isolate a surface of the second semiconductor area;
   a third insulator formed on the semiconductor substrate in the second semiconductor area, and having a thickness thicker than that of the first insulator;
   a conductor layer formed on the third insulator and at least partially formed of the same material as the first electrode, wherein the conductor layer is formed with the same layer as the first electrode, and all side surfaces parallel to a longitudinal direction of the conductor layer are in contact with the second isolation;
   a fourth insulator formed on an upper surface of the conductor layer; and
   third and fourth electrodes formed on the fourth insulator at each end of the conductor layer, respectively, including the same material as at least a part of the second electrode therein, and connected with the conductor layer;

wherein a top surface of the second isolation is higher than a top surface of the semiconductor substrate, and the top surface of the second isolation is higher than a top surface of the first isolation.

2. The semiconductor device according to claim 1, wherein the resistance element includes a plurality of conductor layers having the same width arranged cyclically and in parallel, and contains a plurality of first resistance element components each including a first conductor layer disposed inside and a plurality of second resistance element components each including a second conductor layer, two of the second resistance element components being disposed at each side of the resistance element, the second resistance element components being electrically separated from the first resistance element components.

3. The semiconductor device according to claim 2, wherein at least two of the first resistance element components are electrically connected with each other through at least one of the third and fourth electrodes.

4. The semiconductor device according to claim 3, wherein the plurality of first resistance element components are electrically connected in series.

5. The semiconductor device according to claim 2, wherein a connection area connecting the first conductor layer of the resistance element and the third or fourth electrode has a long shape in a longitudinal direction of the conductor layer within an area of the first conductor layer.

6. The semiconductor device according to claim 1, wherein the second, third and fourth electrodes comprise at least a metal silicide layer or a metal layer.

7. The semiconductor device according to claim 1, wherein the first insulator includes a silicon oxide film or a silicon oxynitride film having a thickness of 4 nm to 12 nm, and the third insulator includes a silicon oxide film or a silicon oxynitride film having a thickness of 13 nm to 50 nm.

8. The semiconductor device according to claim 1, wherein a width of the first isolation is 10 nm to 140 nm, and a width of the second isolation is 150 nm to 500 nm.

9. The semiconductor device according to claim 1, further comprising a third conductor layer formed on the fourth insulator of the resistance element, arranged between the third and fourth electrodes, electrically separated from the third and fourth electrodes, and formed of the same material as at least a part of the second electrode, wherein a width of the third conductor layer is 150 nm to 500 nm, and a length of the third conductor layer is 1 µm to 1 mm.

10. A semiconductor device comprising:
a non-volatile semiconductor storage element formed in a first semiconductor area of a semiconductor substrate; and
a resistance element formed in a second semiconductor area of the semiconductor substrate,
the non-volatile semiconductor storage element comprising:
a first isolation formed in a first trench provided in the semiconductor substrate to isolate a surface of the first semiconductor area;
a first insulator formed on the semiconductor substrate in the first semiconductor area;
a first electrode formed on the first insulator including a lower first electrode and an upper first electrode, and a width of the upper first electrode being wider than a width of the lower first electrode, wherein side surfaces of the lower first electrode are in contact with the first isolation;
a second insulator formed on at least an upper surface of the first electrode; and
a second electrode formed on the second insulator,
the resistance element comprising:
a second isolation formed in a second trench provided in the semiconductor substrate to isolate a surface of the second semiconductor area;
a third insulator formed on the semiconductor substrate in the second semiconductor area, and having a thickness thicker than that of the first insulator;
a conductor layer which is formed on the third insulator, includes a lower conductor layer and an upper conductor layer and includes the same material as the first electrode therein, and a width of the upper conductor layer being wider than a width of the lower conductor layer, wherein the conductor layer is formed with the same layer as the first electrode, and all side surfaces parallel to a longitudinal direction of the upper conductor layer are in contact with the second isolation;
a fourth insulator formed on an upper surface of the conductor layer; and
third and fourth electrodes formed on the fourth insulator at each end of the conductor layer, respectively, including the same material as at least a part of the second electrode therein, and connected with the conductor layer;
wherein a top surface of the second isolation is higher than a top surface of the semiconductor substrate, a bottom of the second isolation is lower than a bottom of the third insulator, and the top surface of the second isolation is higher than a top surface of the first isolation.

11. The semiconductor device according to claim 10, wherein the resistance element includes a plurality of conductor layers having the same width arranged cyclically and in parallel, and contains a plurality of first resistance element components each including a first conductor layer disposed inside and a plurality of second resistance element components each including a second conductor layer, two of the second resistance element components being disposed at each side of the resistance element, the second resistance element components being electrically separated from the first resistance element components.

12. The semiconductor device according to claim 11, wherein at least two of the first resistance element components are electrically connected with each other through at least one of the third and fourth electrodes.

13. The semiconductor device according to claim 11, wherein a connection area connecting the first conductor layer of the resistance element and the third or fourth electrode has a long shape in a longitudinal direction of the first conductor layer within an area of the first conductor layer.

14. The semiconductor device according to claim 10, wherein the second, third and fourth electrodes comprise at least a metal silicide layer or a metal layer.

15. The semiconductor device according to claim 10, wherein the first insulator includes a silicon oxide film or a silicon oxynitride film having a thickness of 4 nm to 12 nm, and the third insulator includes a silicon oxide film or a silicon oxynitride film having a thickness of 13 nm to 50 nm.

16. The semiconductor device according to claim 10, wherein a width of the first isolation is 10 nm to 140 nm, and a width of the second isolation is 150 nm to 500 nm.

17. The semiconductor device according to claim 10, comprising a third conductor layer formed on the fourth insulator of the resistance element, arranged between the third and fourth electrodes, electrically separated from the third and fourth electrodes, and formed of the same material as at least a part of the second electrode, wherein a width of the third conductor layer is 150 nm to 500 nm, and a length of the third conductor layer is 1 µm to 1 mm.

18. The semiconductor device according to claim 1, wherein the third or fourth electrode is wider than the conductor layers by a range between 0.02 μm and 0.5 μm in a transverse direction of the conductor layer, and a part of the third or fourth electrode is formed on the second isolation.

19. The semiconductor device according to claim 10, wherein the third or fourth electrode is wider than the conductor layers by a range between 0.02 μm and 0.5 μm in a transverse direction of the conductor layer, and a part of the third or fourth electrode is formed on the second isolation.

20. The semiconductor device according to claim 4, wherein the number of the second resistance element components is two.

21. The semiconductor device according to claim 1, wherein a bottom of the second isolation is positioned at a lower level than a bottom of the third insulator.

* * * * *